(12) United States Patent
Kang

(10) Patent No.: US 6,297,985 B1
(45) Date of Patent: Oct. 2, 2001

(54) CELL BLOCK STRUCTURE OF NONVOLATILE FERROELECTRIC MEMORY

(75) Inventor: Hee Bok Kang, Daejeon-si (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/650,403

(22) Filed: Aug. 29, 2000

(30) Foreign Application Priority Data

Sep. 7, 1999 (KR) .................................................. 99-37956

(51) Int. Cl.[7] ...................................................... G11C 11/22
(52) U.S. Cl. ...................... 365/145; 365/210; 365/230.03
(58) Field of Search ..................................... 365/145, 210, 365/230.03

(56) References Cited

U.S. PATENT DOCUMENTS

| 4,873,644 | 10/1989 | Eaton, Jr. ............................. 365/145 |
| 5,524,093 | * 6/1996 | Kuroda ................................. 365/145 |
| 5,680,344 | 10/1997 | Seyyedy ............................... 365/145 |
| 6,038,160 | * 3/2000 | Nakane et al. ....................... 365/145 |
| 6,078,530 | * 6/2000 | Choi ..................................... 365/145 |
| 6,118,687 | * 9/2000 | Kang .................................... 365/145 |

\* cited by examiner

Primary Examiner—Son T. Dinh
(74) Attorney, Agent, or Firm—Fleshner & Kim, LLP

(57) ABSTRACT

Cell block structure of a nonvolatile ferroelectric memory is provided that can reduce loading on a bitline and simplify sense amplifier block arrangement and design. The nonvolatile ferroelectric memory can include a cell array block having split wordlines controlled by a wordline driver and a cell block selection switching unit that separates the cell array block into a first region and a second region. Each switch in the cell block selection switching unit is selectively coupled to a bitline for the first region and a bitline for the second region. First and second sense amplifier arrays sense a data from a cell array either in the first region or the second region selected by the cell block selection switching unit.

20 Claims, 18 Drawing Sheets

CELL BLOCK STRUCTURE OF NONVOLATILE FERROELECTRIC MEMORY

BACKGROUND OF THE INVENTION

1. Field of the Invention

The present invention relates to a semiconductor memory device, and more particularly, to a memory array of a nonvolatile ferroelectric memory.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

A related art nonvolatile ferroelectric memory device will now be described. FIG. 1 shows unit cell of a related art nonvolatile ferroelectric memory.

As shown in FIG. 1, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

FIG. 2 is a block diagram showing the related art nonvolatile ferroelectric memory device having a cell structure of 1T/1C. As shown in FIG. 2, the related art nonvolatile ferroelectric memory device includes a main cell array 41, a reference cell array 42 assigned on a lower part of the main cell array 41, a wordline driver 43 formed at a side of the main cell array for applying a driving signal to the main cell array 41 and the reference cell array 42, and a sense amplifier unit 44 formed at a lower part of the reference cell array 42.

The wordline driver 43 applies the driving signal to a main wordline of the main cell array 41 and a reference wordline of the reference cell array 42. The sense amplifier unit 44 includes a plurality of sensing amplifiers and amplifies signals of a corresponding bitline B/L and bit bar line BB/L.

FIG. 3 is a partially detailed view of FIG. 2. As shown in the drawing, the main cell array has a folded bitline structure in the same manner as DRAM.

Also, the reference cell array 42 has a folded bitline structure and includes a reference cell wordline and reference cell plate line in pairs. At this time, reference cell wordline and the reference cell plate line pairs are defined as RWL_N-1 and RPL_N-1, and RWL_N and RPL_N, respectively.

When the main cell wordline MWL_N-1 and the main cell plate line MPL_N-1 are activated, the reference cell wordline RWL_N-1 and the reference cell plate line RPL_N-1 are activated. Therefore, data in the main cell is loaded into the bitline B/L and data in the reference cell is loaded into the bit bar line BB/L.

When the main cell wordline MWL_N and the main cell plate line MPL_N are activated, the reference cell wordline RWL_N and the reference cell plate line RPL_N are activated. Therefore, data in the main cell is loaded into the bit bar line BB/L and data in the reference cell is loaded into the bitline B/L.

The reference voltage REF by the reference cell exists between the bitline levels B_H (high) and B_L (low) by the main cell. To generate the reference voltage REF between the bitline levels B_H and B_L, the logic value "1" or "0" may be stored in a capacitor of the reference cell. When the logic value "1" is stored in the capacitor of the reference cell, the size of the capacitor of the reference cell is smaller than that of the capacitor of the main cell. When the logic value "0" is stored in the capacitor of the reference cell, the size of the capacitor of the reference cell is greater than that of the capacitor of the main cell. Thus, the related art nonvolatile ferroelectric memory can produce the reference voltage required by the sense amplifier unit 44 two ways.

A system of a sense amplifier unit in the related art ferroelectric memory will now be described. FIG. 4 is a circuit diagram illustrating one of the plurality of sensing amplifiers constituting the sense amplifier unit 44 of FIG. 3. As shown in FIG. 4, the related art sensing amplifier has a structure of a latch type sensing amplifier.

In other words, the sensing amplifier in FIG. 4 includes two PMOS transistors and two NMOS transistors, and these PMOS and NMOS transistors have latch type inverter structures. The first PMOS transistor MP1 and the second PMOS transistor MP2 face each other. An output terminal of the first PMOS transistor MP1 is connected to a gate of the second PMOS transistor MP2, and an output terminal of the second PMOS transistor MP2 is connected to a gate of the first PMOS transistor MP1. A SAP signal is commonly applied to input terminals of the first and second PMOS transistors MP1 and MP2. The SAP signal is an active signal that activates the first and second PMOS transistors MP1 and MP2.

The first NMOS transistor MN1 is connected to the output terminal of the first PMOS transistor MP1 in series. The second NMOS transistor MN2 is connected to the output terminal of the second NMOS transistor MN2 in series. The output terminal of the second NMOS transistor MN2 is connected to a gate of the first NMOS transistor MN1, and the output terminal of the first NMOS transistor MN1 is connected to a gate of the second NMOS transistor MN2.

A SAN signal is commonly applied to input terminals of the first and second NMOS transistors MN1 and MN2. The SAN signal is an active signal that activates the first and second NMOS transistors MN1 and MN2.

The output terminals of the first PMOS transistor MPI and first NMOS transistor MN1 are commonly connected to the bitline B_N. The output terminals of the second PMOS transistor MP2 and the second NMOS transistor MN2 are connected to the next bitline B_N+1.

The output of the sensing amplifier is respectively connected to the bitlines B_N and B_N+1 to be input and output to the main cell and the reference cell, respectively, thereby enabling input/output to the main cell and the reference cell.

The SAP signal, the SAN signal, and the signals of B_N and B_N+1 are all maintained at ½ Vcc for a precharged period when the sensing amplifier is not active. On the other hand, the SAP signal is pulled-up at high level and the SAN signal is pulled-down at low level.

A layout of a related art sense amplifier array will now be described. FIG. 5 illustrates a block of ferroelectric memory cells having a latch type sense amplifier employed therein.

When the cell block has a system of an open bit line, the sensing amplifier is disposed between two cell array blocks 1 and 2 with two input terminals connected to respective bitlines for the cell array blocks 1 and 2.

As described above, the related art nonvolatile ferroelectric memory has various disadvantages. First, the use of different data buses in reading and writing data leads to a requirement for many data buses, which impedes an efficient reduced size layout design. Second, since an input terminal of the sensing amplifier is directly selectively connected to the upper and lower bitlines, loads between the bit line and the bit bar line may differ. Accordingly, since an amplification may occur in a state of different loads, the amplification may become unstable. Thus, the stability of amplification following read and write can not be expected. Third, the sense amplifier array provided in correspondence to the cell array block causes a limit in providing faster data input/output operations of the device because of bitline loading and difficulty in reducing a layout area for an entire chip array, which increases difficulty in an efficient disposal of cell arrays and sense amplifier arrays and leads to an increased time from memory design to mass production that reduces competitiveness of the product.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the present invention is to provide a cell block structure of a nonvolatile ferroelectric memory that substantially obviates one or more of the problems caused by limitations and disadvantages of the related art.

Another object of the present invention is to provide a cell block structure of a nonvolatile ferroelectric memory that can reduce a load on bitlines.

Another object of the present invention is to provide a cell block structure of a nonvolatile ferroelectric memory that allows rearranging of sense amplifier blocks.

Another object of the present invention is to provide a cell block structure of a nonvolatile ferroelectric memory that reduces a load of bitlines and an efficient or reduced layout of sense amplifier blocks.

To achieve at least these and other objects and advantages in a whole or in part and in accordance with the purpose of the present invention, as embodied and broadly described, a cell block structure of a nonvolatile ferroelectric memory, inclusive of a cell array block having split wordlines coupled to a split wordline driver block and controlled by the split wordline driver block, includes a cell block selection switching unit disposed in a separation region of the cell array block between a first region and a second region, and having one electrode coupled to a bitline for the first region, and the other electrode coupled to a bitline for the second region, and first and second sense amplifier arrays that sense data from a cell array either in the first region or the second region selected by the cell block selection switching unit.

To further achieve the above objects and advantages in a whole or in part and in accordance with the present invention there is provided a semiconductor memory device that includes a cell array block having split wordlines extending along a first direction and bitlines extending along a second direction to cross the split wordlines, a driver that controls the split wordline, a cell block selection circuit that separates the cell array block into a first region and a second region, wherein the cell block selection circuit has one electrode coupled to a bitline for the first region, and the other electrode coupled to a bitline for the second region and at least one sense amplifier array coupled to the bitlines that respectively senses a data from a cell array selected by the cell block selection circuit in one of the first region and the second region.

To further achieve the above objects and advantages in a whole or in part and in accordance with the present invention there is provided a nonvolatile ferroelectric memory that includes a cell array block with a main cell region and a column reference cell region, wherein the cell array block has split first signal lines extending along a first direction and second signal lines extending along a second direction to cross the split first signal lines at prescribed intervals, a cell block selection circuit that includes a plurality of switches in a separation region of the cell array block that separates the cell array block into a first and a second regions, wherein each of the switches has a first electrode coupled to a second signal line for the first region and a second electrode coupled to a second signal line for the second region, a first sense amplifier array that includes a first plurality of sense amplifiers, wherein each of the first sense amplifiers has a first input terminal coupled to an output line of a first group of the plurality of switches, a second sense amplifier array that includes a second plurality of sense amplifiers, wherein each of the second sense amplifiers has a first input terminal coupled to an output line of a second group of the plurality of switches and at least one reference signal generator coupled to an output line of a switch of the cell block selection circuit coupled to second signal lines for the column reference cell region that provides a reference signal to the sense amplifiers.

To further achieve the above objects and advantages in a whole or in part and in accordance with the present invention there is provided a nonvolatile ferroelectric memory that includes cell array blocks that each include a plurality of split wordlines and bitlines substantially perpendicular to the split wordlines, a plurality of split wordline drivers provided between two of the cell array blocks that each control unit cells in the two cell array blocks, a cell block selection switching unit that includes switches that separate a first cell array block into a first and a second regions, wherein each of the switches has a first electrode coupled to a corresponding bitline of the first region and a second electrode coupled to a corresponding bitline of the second region and first and second sense amplifier arrays respectively above and below a corresponding cell array block to sense data of one of the first region and the second region cell of the corresponding cell array block selected by the cell block selection switching unit, wherein the sense amplifier array provided between adjacent cell array blocks controlled by different ones of the plurality of split wordline drivers are shared by the adjacent cell array blocks.

To further achieve the above objects and advantages in a whole or in part and in accordance with the present invention there is provided It is to be understood that both the foregoing general description and the following detailed description are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
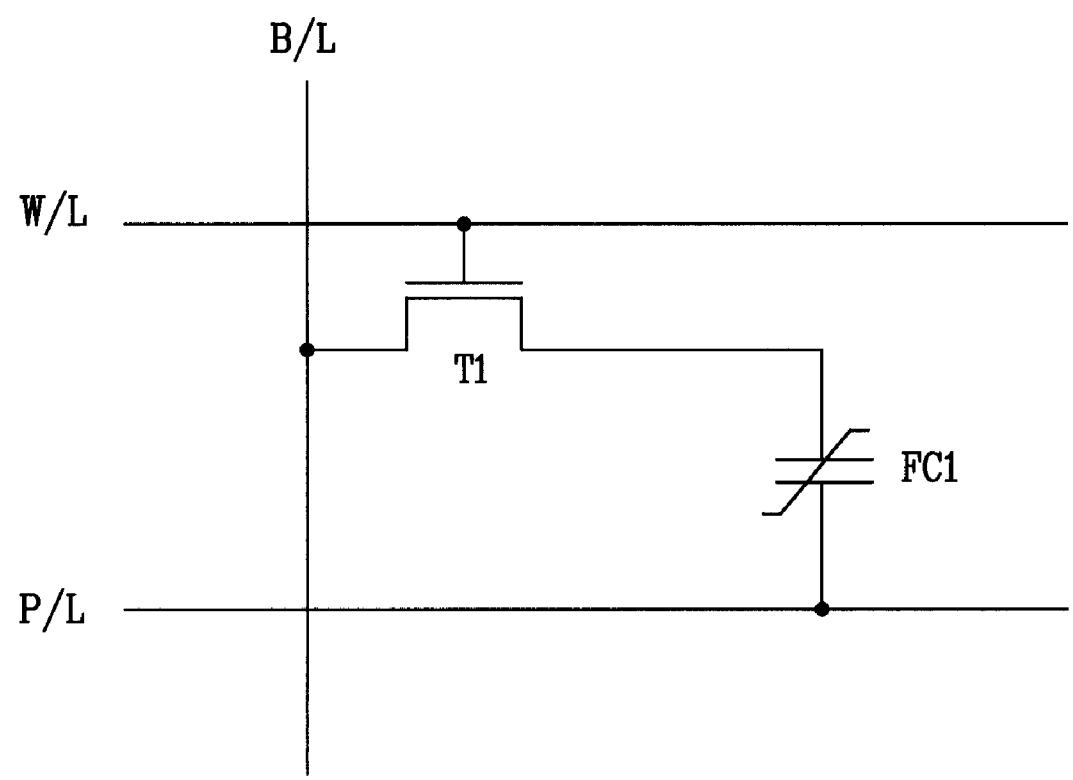
FIG. 1 is a schematic diagram that illustrates a unit cell in a related art ferroelectric memory.
Figure 2:
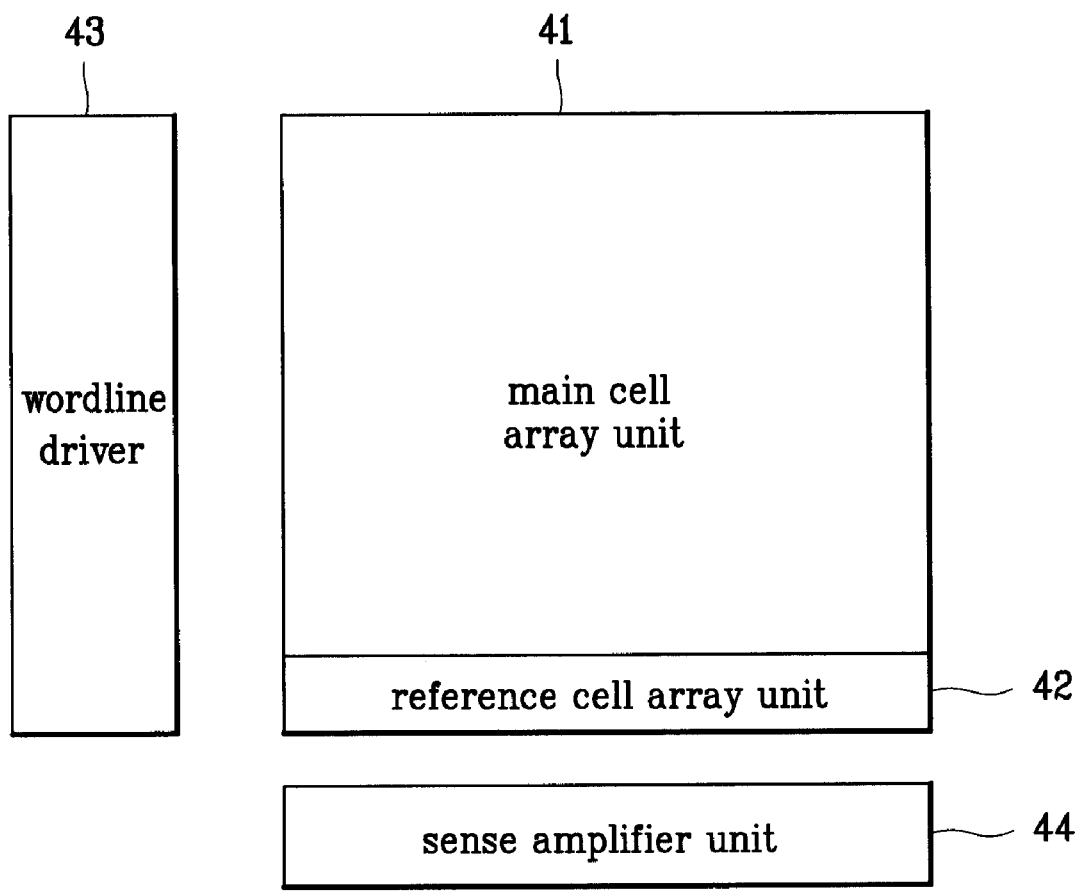
FIG. 2 is a block diagram that illustrates the related art ferroelectric memory.
Figure 3:
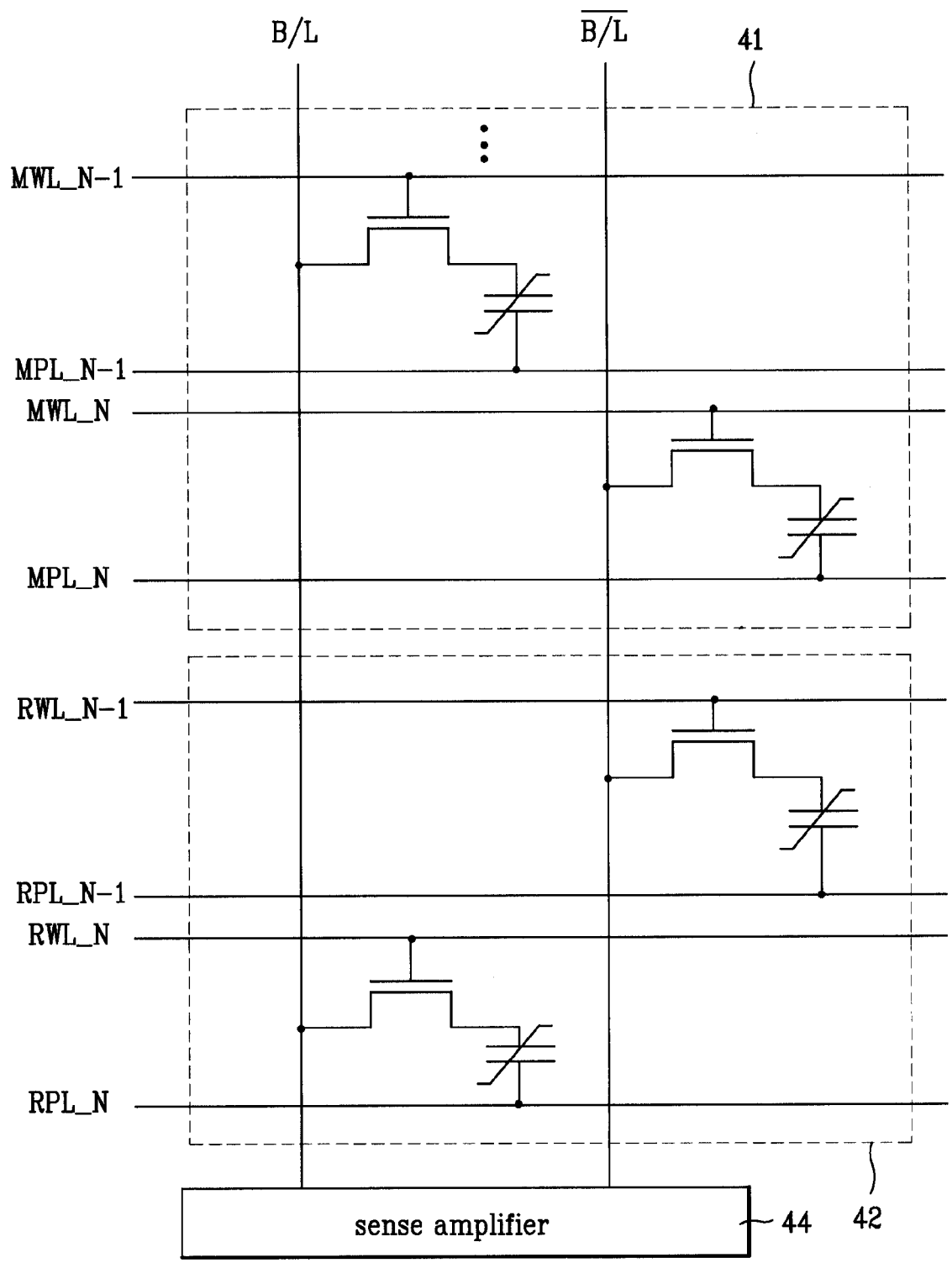
FIG. 3 is a diagram that illustrates a schematic circuit of the related art ferroelectric memory in FIG. 2.
Figure 4:
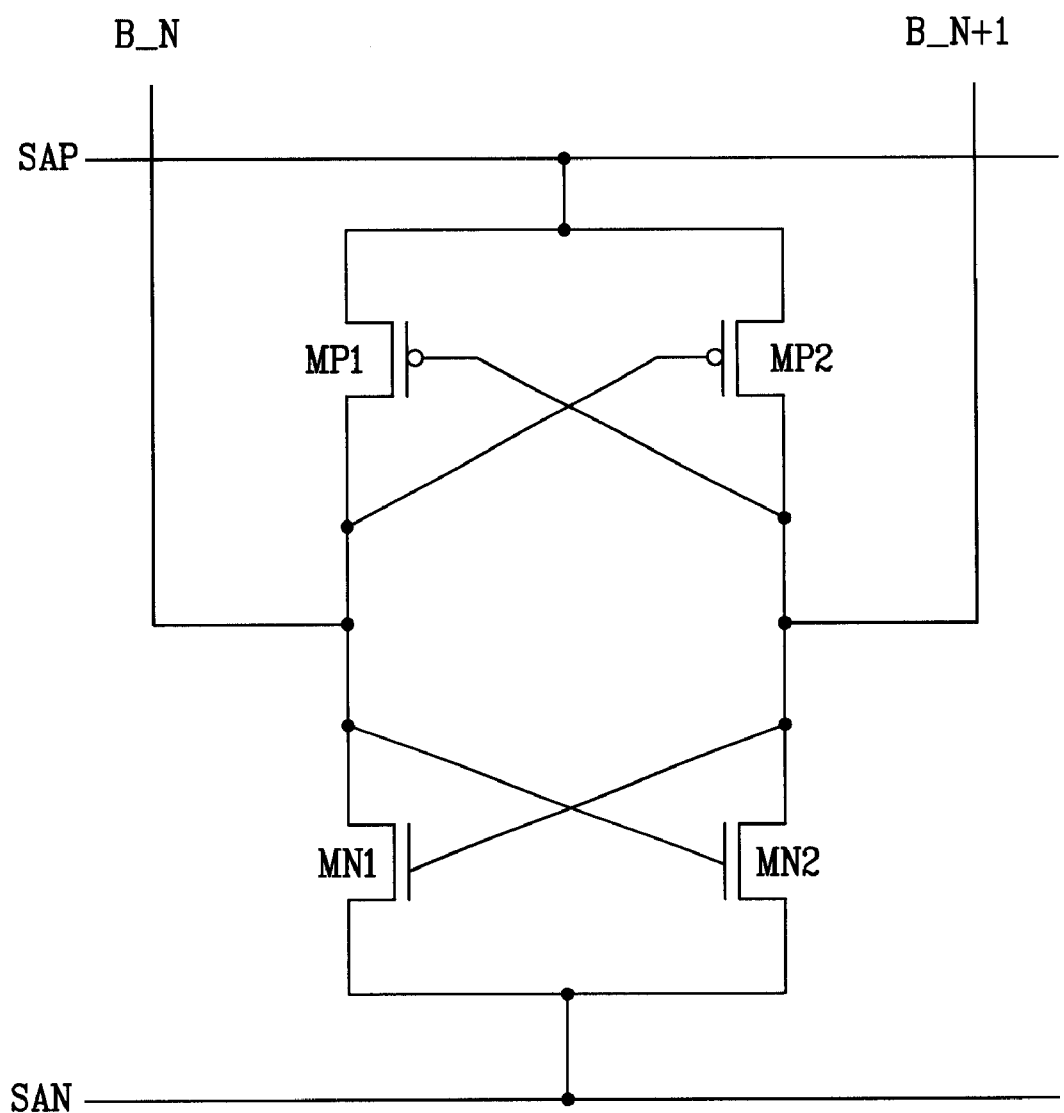
FIG. 4 is a schematic diagram that illustrates a circuit of a sense amplifier in the related art ferroelectric memory.
Figure 5:
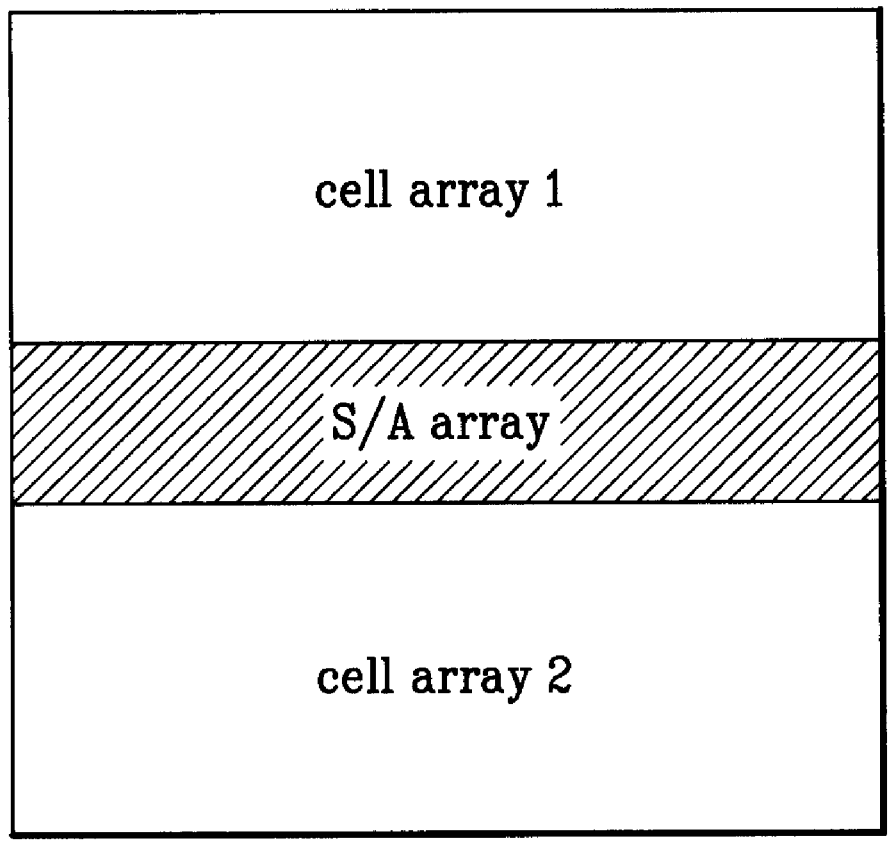
FIG. 5 is a diagram that illustrates a block of ferroelectric memory cells having a latch type sense amplifier.
Figure 6:
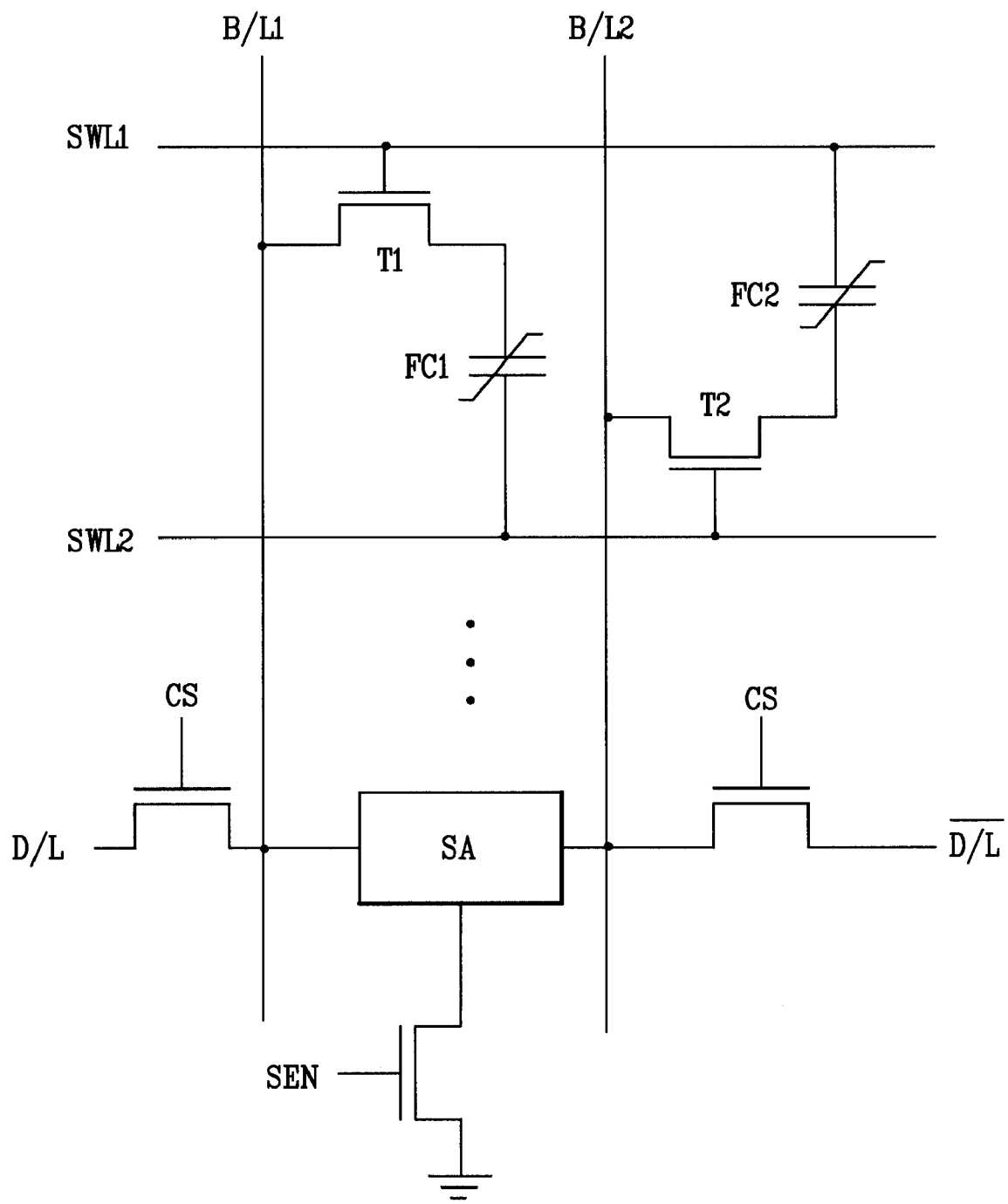
FIG. 6 is a schematic diagram that illustrates a circuit of a split wordline ferroelectric memory in accordance with preferred embodiments of the present invention.

A system of unit cell in an array of a nonvolatile ferroelectric memory according to preferred embodiments of the present invention will be described. FIG. 6 is a schematic diagram that illustrates a circuit of a ferroelectric memory in accordance with preferred embodiments of the present invention.

As shown in FIG. 6, a unit cell of the nonvolatile ferroelectric memory device includes first and second split wordlines SWL1 and SWL2 formed with a prescribed interval in a row direction, and first and second bitlines B/L1 and B/L2 formed across the first and second split wordlines SWL1 and SWL2. A first transistor T1 has a gate coupled with the first split wordline SWL1 and drain coupled with the first bitline B/L1. A first ferroelectric capacitor FC1 is coupled between a source of the first transistor T1 and the second split wordline SWL2. A second transistor T2 has a gate coupled with the second split wordline SWL2 and drain coupled with the second bitline B/L2, and a second ferroelectric capacitor FC2 is coupled between a source of the second transistor T2 and the first split wordline SWL1. Sensing amplifiers are formed between the respective bitlines to sense data transmitted through the bitlines and transfer the sensed data to a data line DL or a data bar line /DL. At this time, a sensing amplifier enables portion and a selection switching portion are provided (not shown). The sensing amplifier enable portion outputs a sensing amplifier enable signal SEN to enable the sensing amplifiers SA, and the selection switching portion selectively switches bitlines and data lines and can use a column selection signal CS. A plurality of the unit cells constitute a cell array.

In view of data storage, the unit cell can include a pair of split wordlines, a bitline, a transistor 1T, and a ferroelectric capacitor 1C. The unit cell can also include for example a pair of split wordlines, two bitlines, two transistors 2T, and two ferroelectric capacitors 2C.

Operations of a nonvolatile ferroelectric memory device according to preferred embodiments of the present invention will now be described with reference to a timing chart shown in FIG. 7.

Figure 7:
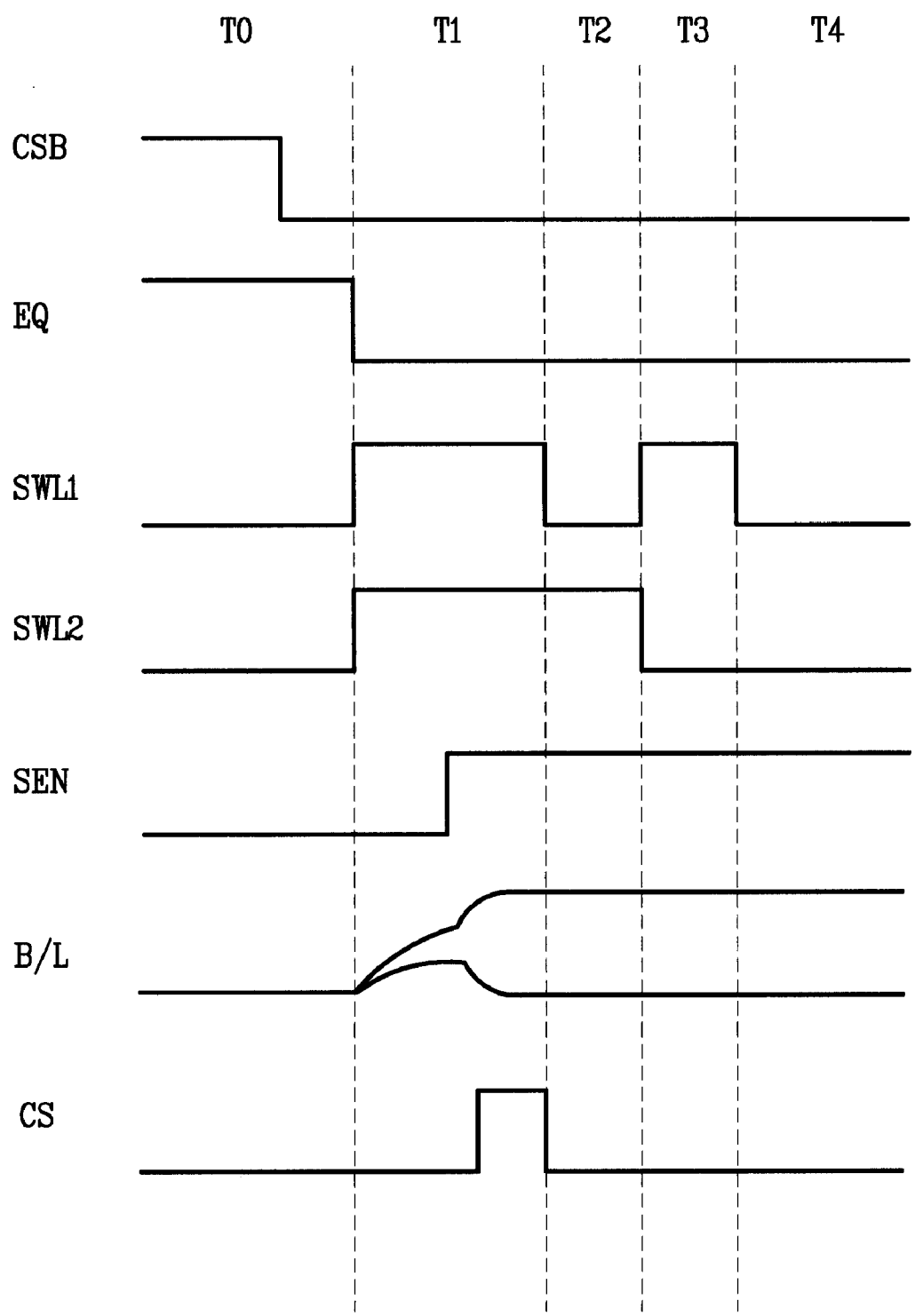
FIG. 7 is an operation timing diagram showing a split wordline ferroelectric memory in accordance with preferred embodiments of the present invention.

A T0 period in FIG. 7 denotes a period before the first split wordline SWL1 and the second split wordline SWL2 are activated to "high (H)". In this T0 period, all of bitlines are preferably precharged at a threshold voltage level of an NMOS transistor.

A T1 period denotes a period that the first and second split wordlines SWL1 and SWL2 are all to become "H". In this T1 period, data of the ferroelectric capacitor in the main cell are transmitted to the main bitline so that the bitline level is varied.

At this time, in case of the ferroelectric capacitor having a logic value "high", since electric fields having opposite polarities are applied to the bitline and the split wordline, the polarity of the ferroelectric is destroyed so that a large amount of current flows. Thus, a high voltage in the bitline is induced. By contrast, in case of the ferroelectric capacitor having a logic value "low", since electric fields having the same polarities are applied to the bitline and the split wordline, polarity of the ferroelectric is not destroyed so that a small amount of current flows. Thus, a low voltage is induced in the bitline.

If the cell data are loaded in the bitline sufficiently, the sensing amplifier enable signal SEN is transited to high so as to activate the sensing amplifier. As a result, the bitline level is amplified.

Since the logic date "H" of the destroyed cell can not be restored at the state that the first and second split wordlines SWL1 and SWL2 are high, the data can be restored in T2 and T3 periods. Subsequently, in T2 period, the first split wordline SWL1 is transited to low, the second split wordline SWL2 is maintained at high level, and the second transistor T2 is turned on. At this time, if the corresponding bitline is high, high data is transmitted to one electrode of the second ferroelectric capacitor FC2 so that the logic value "1" is restored.

In the T3 period, the first split wordline SWL1 is transited to high, the second split wordline SWL2 is transited to low, and the first transistor T1 is turned on. At this time, if the corresponding bitline is high, high data is transmitted to one electrode of the first ferroelectric capacitor FC1 so that logic value "1" is restored.

Figure 8:
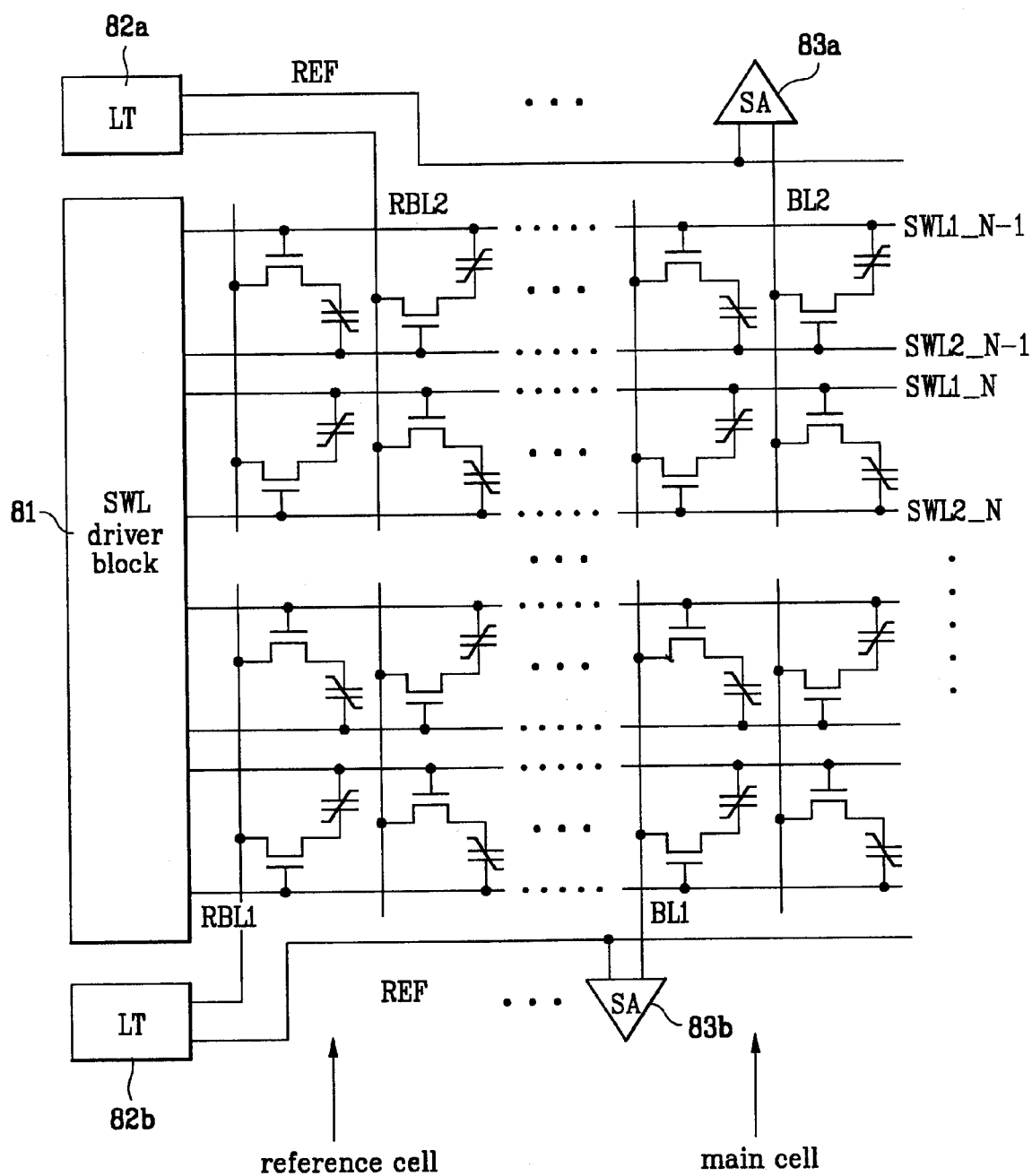
FIG. 8 is a diagram that illustrates a circuit of 1T1C ferroelectric memory inclusive of reference cells according to preferred embodiments of the present invention.

FIG. 8 is a diagram that illustrates a circuit of 1T1C ferroelectric memory inclusive of reference cells according to the preferred embodiments. An array of 1T1C ferroelectric memory according to the preferred embodiments may be divided into a reference cell region and a main cell region. The array of the main cell region has a split wordline structure with reference cells RC in a column portion in one side of the main cell array. If it is assumed that the two split wordlines in the array are SWL1_N−1, SWL2_N−1 and SWL1_N, SWL2_N, when one pair of split wordlines are enabled by a SWL driver block 81, the cells in the main cell region and the reference cell region are enabled. The data in the main cell is transferred to main bitlines BL1, BL2, and therefrom to sense amplifier 83a and 83b, and the data in the reference cell is transferred to reference bitlines RBL1, RBL2. As shown in FIG. 8, a reference bitline signal is used, not directly, but provided to the sense amplifier after the reference bitline signal is amplified through a level shift tracer (LT) 82a and 82b. In this instance, the reference bitline signal is preferably equal to a logic zero of the main bitline because sizes of the main cell and the reference cell are made the same, and the reference cell is adapted to store a logic zero. Therefore, the level shift tracer detects a level of the reference bitline and provides an output having a ΔV added to the reference bitline level. The output level is between a level high and a level low on the main bitline caused by the main cell. As the reference cell receives a signal from the split wordline, the foregoing 1T1C ferroelectric memory is stable, and degradation of the cell is suppressed.

When the ferroelectric memory has the system as shown in FIG. 8, since the sense amplifier array provided in correspondence to the cell array block having cells controlled by one SWL driver block, there is a limit in providing faster data input/output operation of the device because of bitline loading and difficulty in reducing a layout area for an entire chip array. The bitline loading and the layout area causes difficulty in an efficient disposal of cell arrays and sense amplifier arrays that requires much time from memory design to mass production, which reduces competitiveness of a corresponding product.

Figure 9:
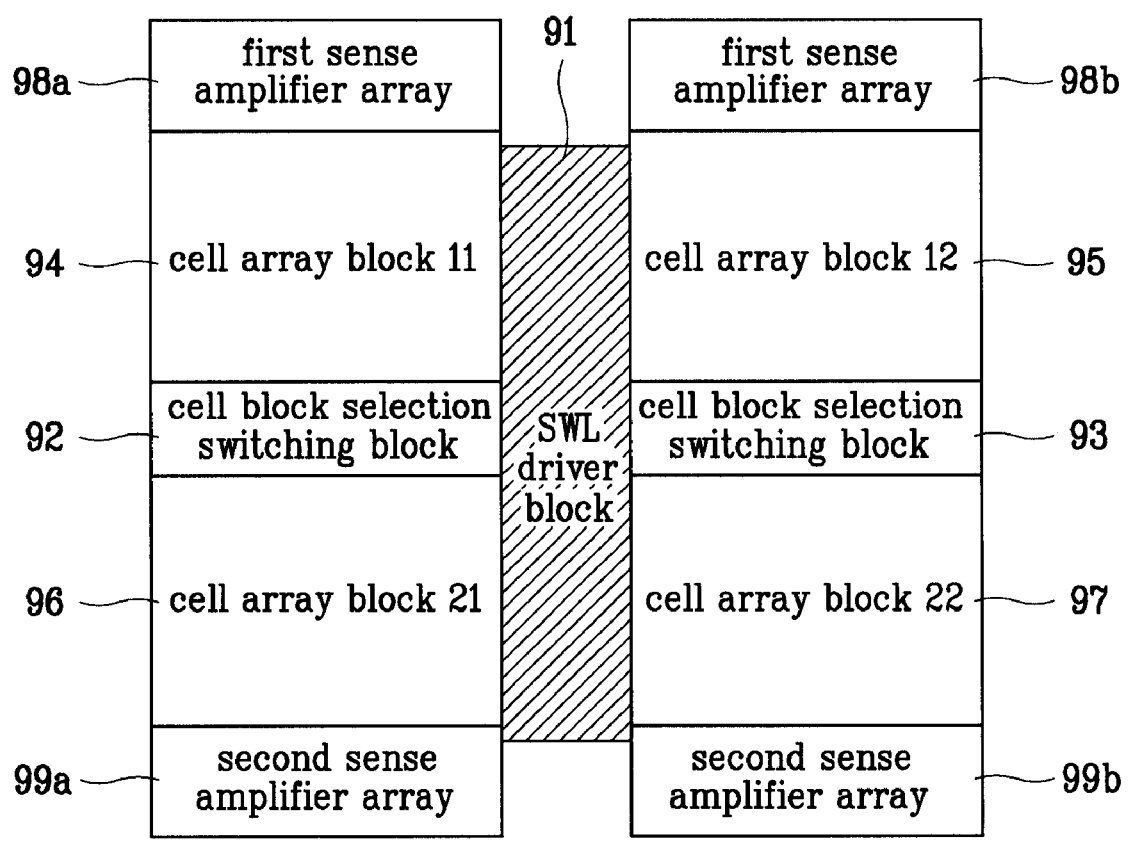
FIG. 9 is a diagram that illustrates a preferred embodiment of a cell array block according to the present invention.

Preferred embodiments according to the present invention disclose a new cell array structure in which an influence from the bitline loading can be reduced in a data sensing operation, and a layout of the sense amplifier array can reduce bitline size and reduce design and production time. FIG. 9 is a diagram that illustrates a system of a cell array block according to a first preferred embodiment of the present invention. The first preferred embodiment divides a cell array block controlled by one SWL driver block 91 into at least two blocks being upper and lower blocks to reduce an overall bitline loading that occurs in sensing operations.

As shown in FIG. 9, in the first preferred embodiment of a ferroelectric memory according to the present invention, the cell array block controlled by an SWL driver block 91 is divided into a cell array block11 94, a cell array block21 96, a cell array block12 95, and a cell array block22 97, and cell block selection switching blocks 92 and 93 are provided between the cell array block11 94 and the cell array block21 96, and the cell array block12 95 and the cell array block22 97, respectively. Data input/output to/from the cells coupled to odd numbered column bitlines and even numbered column bitlines respectively in the cell array is designed to be done through the first sense amplifier arrays 98a and 98b, or the second sense amplifier arrays 99a and 99b, respectively. However, the present invention is not intended to be so limited. In the first preferred embodiment of the cell block structure of a ferroelectric memory according to the present invention, a unit memory cell system in each cell array block is preferably as shown in FIG. 6.

Figure 10A:
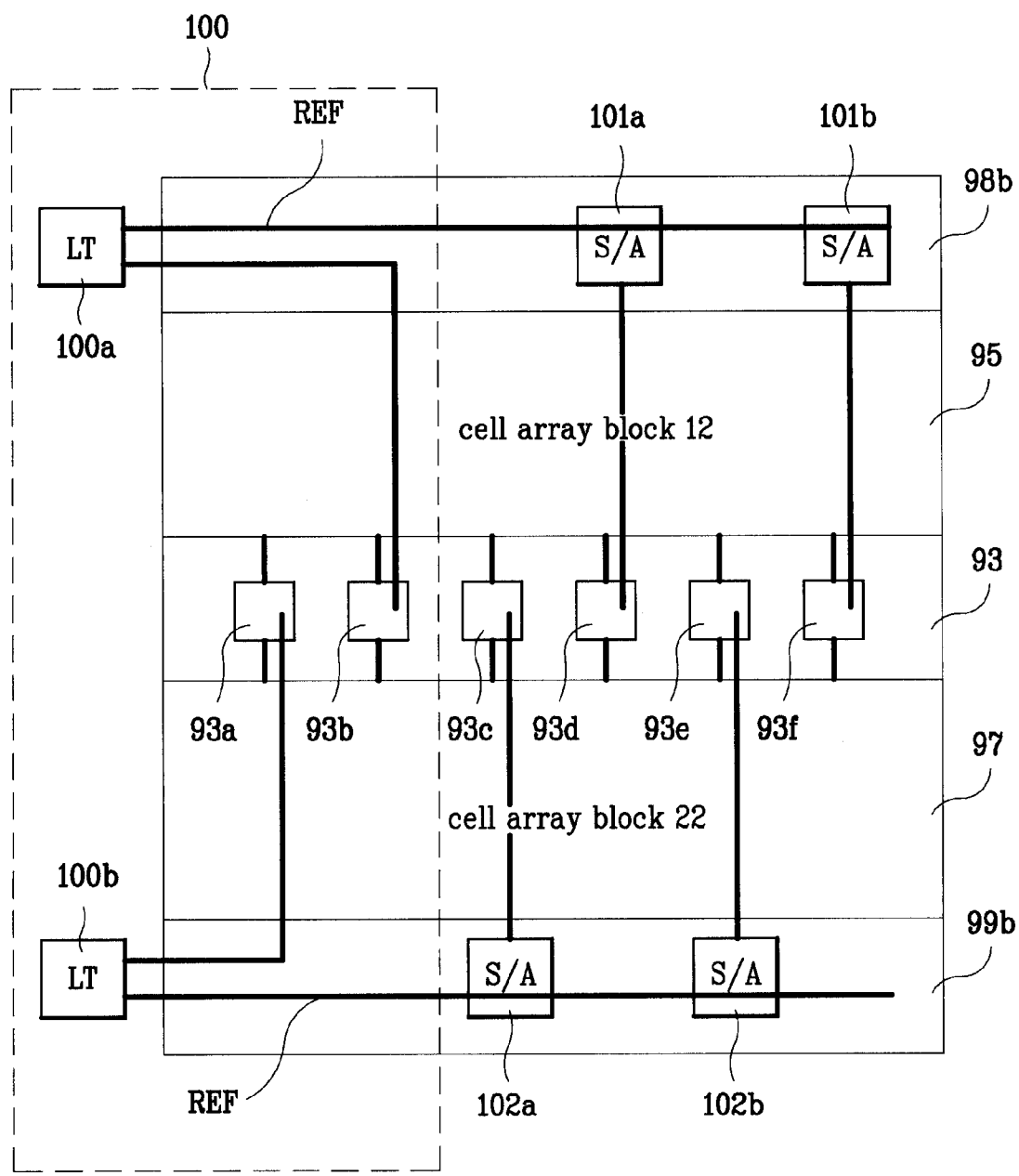
FIGS. 10A and 10B are diagrams that illustrate a cell block selection switching unit according to a preferred embodiment of the present invention.
Figure 10B:
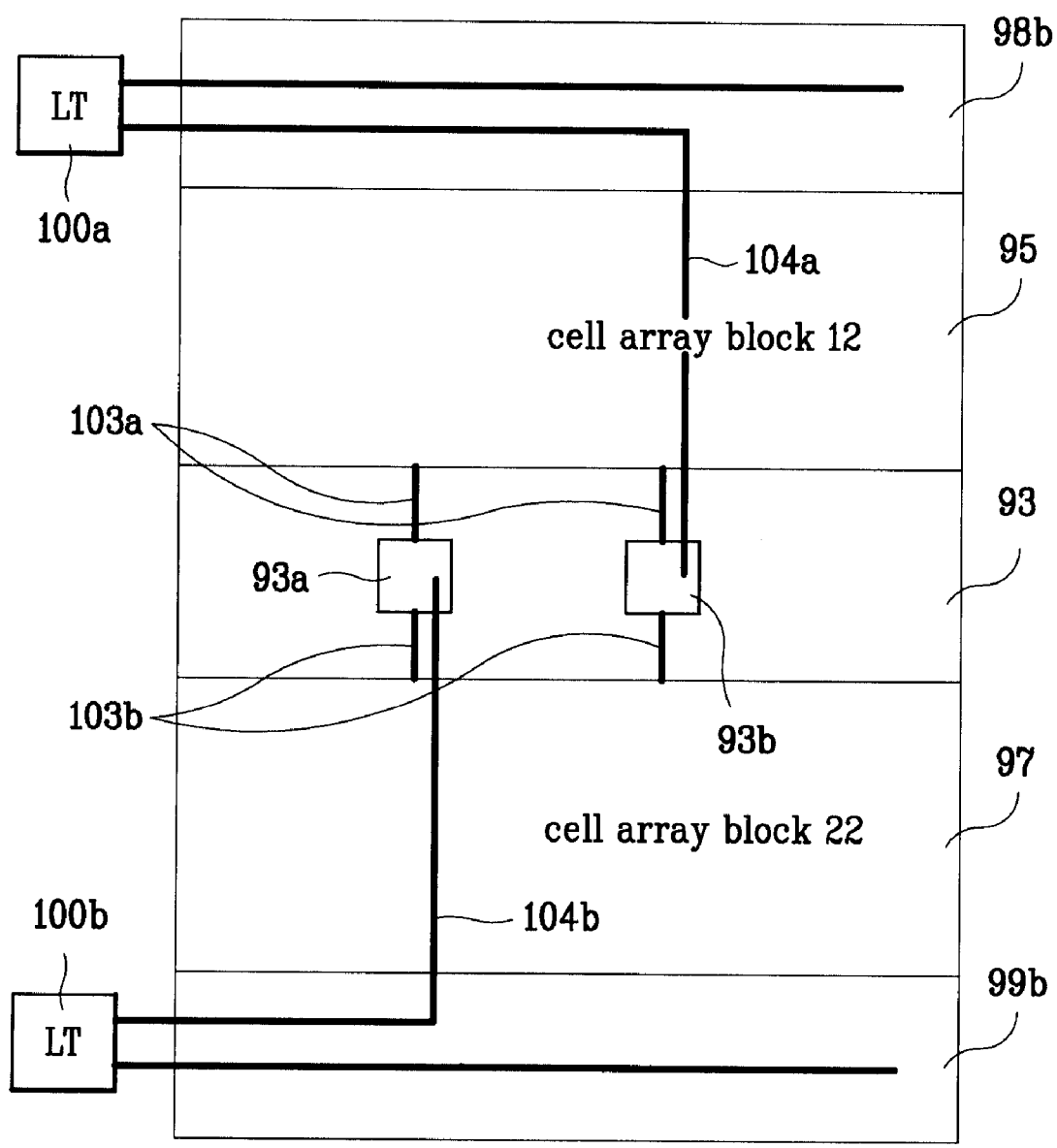

A system of the cell array block will now be described. FIGS. 10A and 10B are diagrams that illustrate a connections in an exemplary cell block selection switching unit according to the first preferred embodiment. FIG. 10A illustrates couplings of the cell block selection switching unit 93 having respective cell block selection switches 93c, 93d, 93e, 93f are provided between cell array blocks 95 and 97, and coupled to bitlines of respective cell array blocks. Signals from respective cell block selection switches are provided to the upper and lower sense amplifiers 101a, 101b, 102a, 102b. The signals from even numbered column cell block switches are provided to the upper sense amplifiers 101a and 101b, and the signals from odd numbered column cell block switches are provided to the lower sense amplifiers 102a and 102b.

A reference level generating unit 100 will now be described. In a column reference cell, the cell block selection switches 93a and 93b have an input terminal coupled to a bitline of the reference cell array, and an output terminal coupled to upper and lower level shift tracers 100a and 100b, respectively. Preferably, output terminals on the even numbered column cell block selection switches (e.g., 93b) are coupled to an input terminal on the upper level shift tracer 100a, and output terminals on the odd numbered column cell block selection switches (e.g., 93a) are coupled to an input terminal on the lower level shift tracer 100b.

As shown in FIG. 10B, the cell block switching unit 93 has odd numbered column cell block selection switches 93a coupled to the upper and lower reference bitlines 103a and 103b, and coupled to lower LT input line 104b. Even numbered column cell block selection switches 93b are coupled to the upper and lower reference bitlines 103a and 103b, and coupled to upper LT input line 104a. The bitlines in the reference cell array, i.e., the upper reference bitline 103a and the lower reference bitline 103b, are preferably formed on the same layer with the bitlines of the main cell array, and the lower LT input line 104b and the upper LT input line 104a are formed on layers different from the bitlines of the cell array block (e.g., usually on an upper layer).

Figure 11:
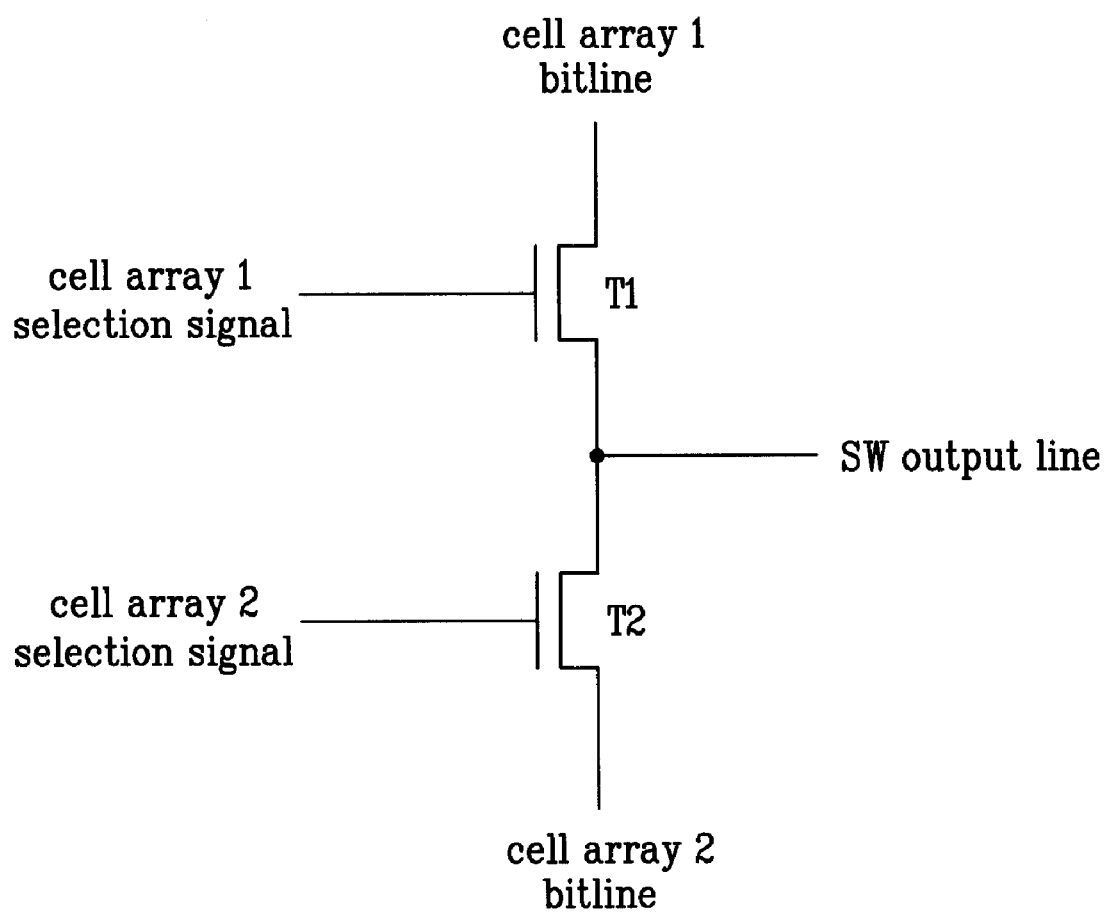
FIG. 11 is a diagram that illustrates a system of an exemplary switching device in a cell block selection switching unit.

A system of each of the cell block selection switches in the cell block selection switching unit will now be described. FIG. 11 is a diagram that illustrates a system of an exemplary switching device in a cell block selection switching unit.

The switching device preferably has a structure in which two NMOS transistor T1 and T2 are coupled in series. A cell array 1 selection signal and a cell array 2 selection signal are provided to respective gates of the NMOS transistors T1 and T2 for selecting a cell array block 1 and a cell array block 2, respectively. For example, if the cell array 1 selection signal is enabled to high, a cell array 1 bitline signal is provided to an SW output line. If the cell array 2 selection signal is enabled to high, a cell array 2 bitline signal is provided to the SW output line.

Couplings in a cell block selection switching unit and a sense amplifier block in accordance with a preferred embodiment of the present invention will now be described.

Figure 12:
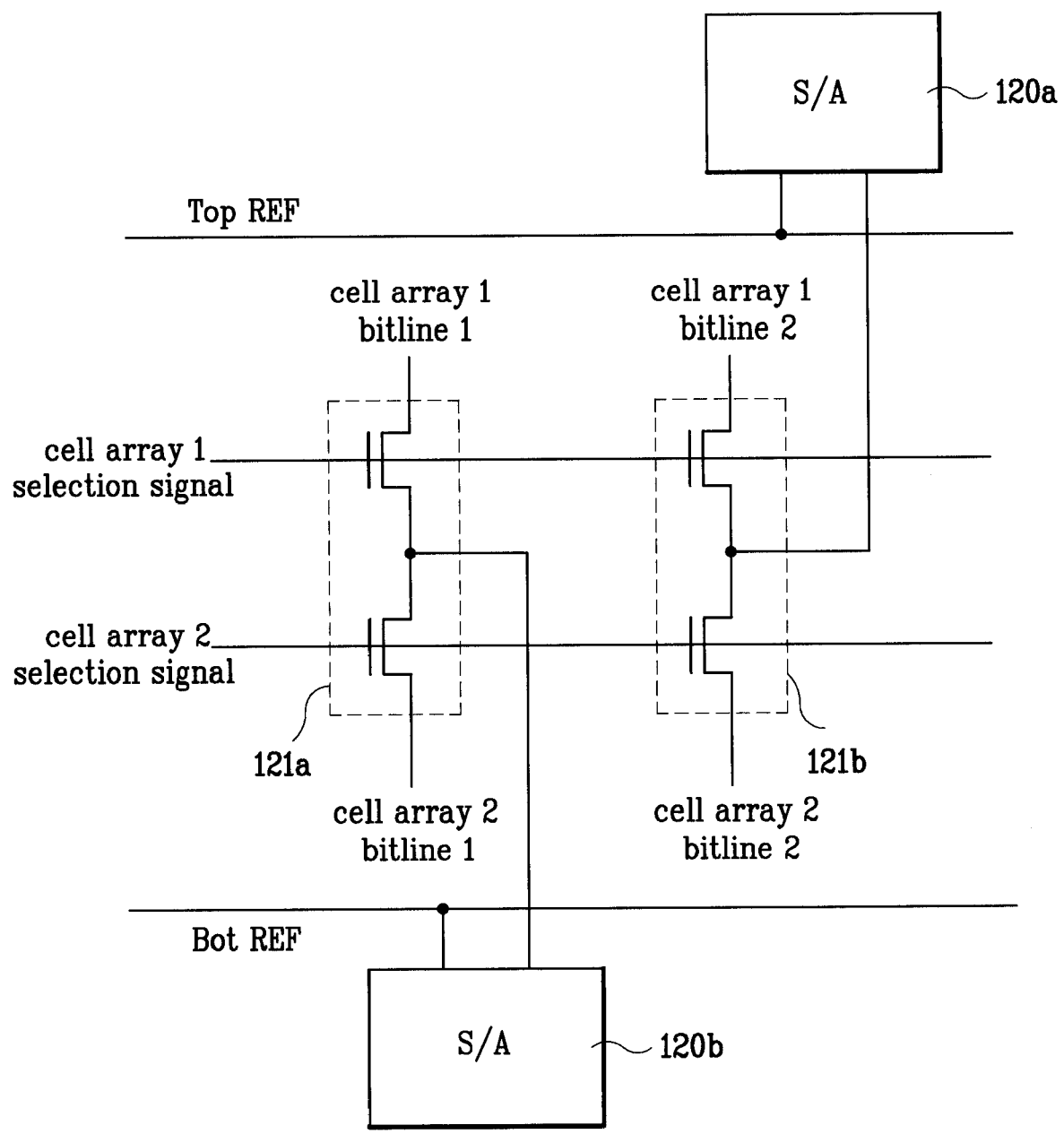
FIG. 12 is a diagram that illustrate a preferred embodiment of couplings in a cell block selection switching unit and a sense amplifier block according to the present invention.

FIG. 12 is a diagram that illustrates additional detail of connections in a cell block selection switching unit and a sense amplifier block in accordance with the preferred embodiment. Switching devices 121a and 121b each preferably having two NMOS transistors coupled in series are coupled to bitlines of the cell array 1 and the cell array 2. However, the present invention is not intended to be so limited. An SW output line of odd numbered column cell block selection switching device 121a is coupled to the lower sense amplifier 120b, and an SW output line of even numbered column cell block selection switching device 121b is coupled to the upper sense amplifier 120a. The upper sense amplifier 120a has one side input terminal that receives an output signal (Top REF) of the upper level shift tracer LT, and the other side input terminal that receives a signal through an SW output line of the even numbered column cell block selection switching device 121b. The lower sense amplifier 120b has one side input terminal that receives an output signal (Bot REF) of the lower level shift tracer LT, and the other side input terminal that receives a signal through an SW output line of the odd numbered column cell block selection switching device 121a.

Figure 13:
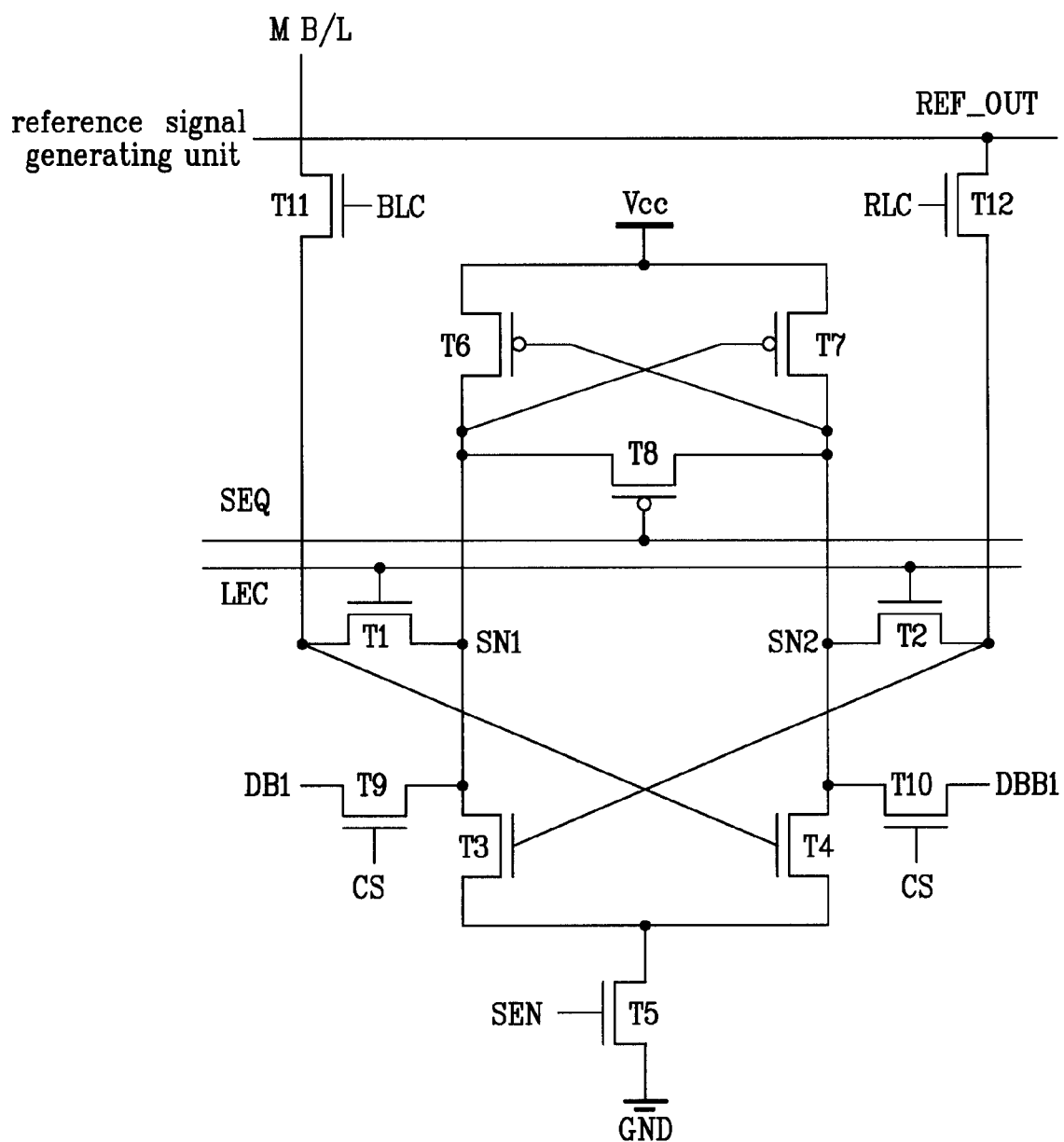
FIG. 13 is a schematic diagram that illustrates a sense amplifier block in FIG. 12.

A system of the upper and lower sense amplifiers 120a and 120b will now be described. FIG. 13 is a schematic diagram that illustrates a sensing amplifier, which is one of the plurality of the sense amplifiers in a sense amplifier array, in accordance with the preferred embodiment.

As shown in FIG. 13, a sense amplifier includes a first transistor T1 for switching a signal from a main bitline provided to a source, a second transistor T2 for switching a reference signal provided to a source, a third transistor T3 having a gate coupled to a source of the second transistor T2 and a drain coupled to a drain of the first transistor T1, and a fourth transistor T4 having a gate coupled to an input terminal on the first transistor T1 and a drain coupled to a drain of the second transistor T2. A fifth transistor T5 has a source coupled to a ground terminal and a drain coupled to sources both of the third and fourth transistors. A sixth transistor T6 has a gate coupled to a drain of the second transistor T2, a source coupled to a power source Vcc, and a drain coupled to the drain of the first transistor T1, and a seventh transistor T7 has a gate coupled to a drain of the first transistor T1, a source coupled to the power source, and a drain coupled to the drain of the second transistor T2. An eighth transistor T8 is for equalizing the drain of the sixth transistor T6 and the drain of the seventh transistor T7. A ninth transistor T9 has a source coupled to a drain of the third transistor T3 for switching an amplified signal from the main bitline to a data bus DB1, and a tenth transistor T10 has a source coupled to a drain of the fourth transistor T4 for switching an inversed phase signal of the amplified signal from the main bitline to a data bar bus DBB1.

In addition, there can be an eleventh transistor T11 for switching the signal from the main bitline to the source of the first transistor T1, and a twelfth transistor T12 for switching the reference signal to the source of the second transistor T2. The reference signal can be provided from a reference signal generating unit (not shown) such as a level shift tracer, or the like. The eleventh transistor T11 is preferably controlled by a main bitline control signal BLC and the twelfth transistor T12 is preferably controlled by a reference bitline control signal RLC. The first transistor T1 may feed an amplified signal back to the gate of the fourth transistor T4, and the second transistor T2 feeds an amplified signal back to the gate of the third transistor T3.

The first and second transistors T1 and T2 are preferably held in a turned on state during data write, and held in a turned off state during data read operations. The ninth and tenth transistors T9 and T10 are preferably controlled by a column selection signal CS. As shown in FIG. 13, the sixth, seventh, and eighth transistors T6, T7 and T8 are PMOS transistors, and the other transistors are NMOS transistors. The fifth transistor T5 is operative in response to an sense amplifier enabling signal SEN, and the eighth transistor T8 is operative in response to a sense amplifier equalizing signal SEQ. The gates of the first and second transistors T1 and T2 are provided with latch enable control signals LEC, respectively.

Figure 14:
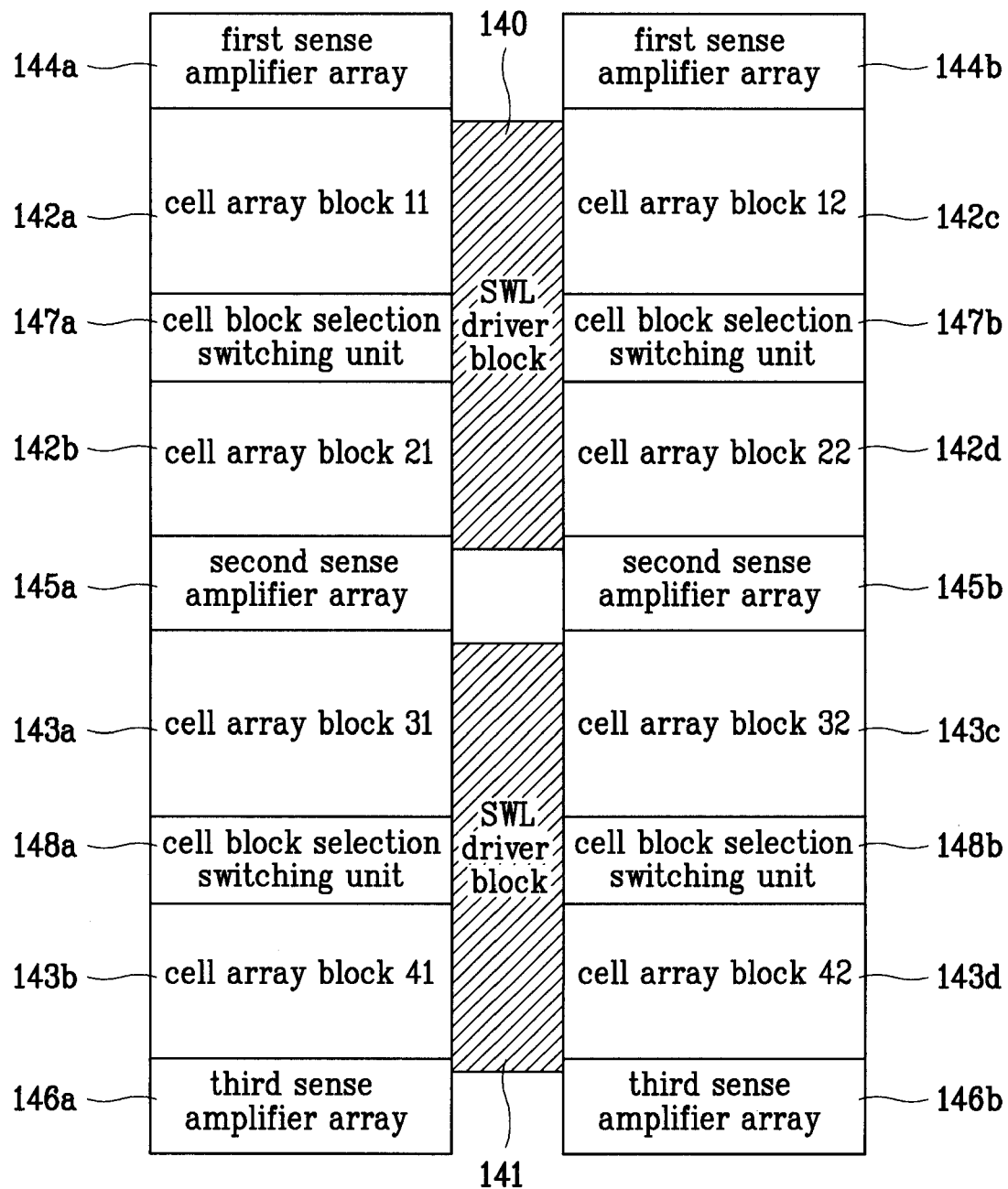
FIG. 14 is a diagram that illustrates another preferred embodiment of cell array blocks according to the present invention.

FIG. 14 is a diagram that illustrates a layout of a memory device having cell array blocks according to a second preferred embodiment of the present invention when cell arrays are controlled by two SWL driver blocks. Thus, the second preferred embodiment is a case when there are more than one SWL, drivers in a cell array block structure. As shown in FIG. 14, one cell array block controlled by one SWL driver block 140 is divided into two, which are an upper and a lower cell array blocks. Another cell array block controlled by another SWL driver block 141 is divided into upper and lower cell array blocks. Switching devices that are for cell selection in data sensing operations are provided between the two divided cell array blocks for reducing bitline loading during operations such as sensing operations. Cells on bitlines coupled to switching devices on an odd numbered column or even numbered column in the lower cell array blocks 142b and 142d controlled by the SWL driver block 140 and the upper cell array block 143a and 143c controlled by the SWL driver block 141 share the second sense amplifier arrays 145a and 145b. Sharing sense amplifier arrays facilitates a reduced size and simplifies overall layout that can decrease design requirements.

As shown in FIG. 14, a system preferably includes a cell array block11 142a, a cell array block21 142b, a cell array block12 142c, and a cell array block22 142d, which are divided from cell array blocks controlled by the SWL driver block 140, and cell block selection switching units 147a and 147b provided between the array block11 142a and the cell array block21 142b, and between the array block12 142c and the cell array block22 142d. The system can also include a cell array block31 143a, a cell array block41 143b, a cell array block32 143c, and a cell array block42 143d, which are divided from cell array blocks controlled by the SWL driver block 141. Cell block selection switching units 148a and 148b are provided between the array block31 143a and the cell array block41 143b, and between the array block32 143c and the cell array block42 143d. Output lines on respective switching devices in the cell block selection switching units 147a, 147b, 148a, and 148b are preferably coupled to the upper sense amplifier arrays and the lower sense amplifier arrays, alternatively. Therefore, data input/output to/from cells coupled to one of the bitline either on the odd numbered column or even numbered column are made through the upper sense amplifier array and the other one are made through the lower sense amplifier array. However, the present invention is not intended to be so limited, other divisions can be used. Further, the cell array blocks controlled by different SWL driver blocks preferably share the sense amplifier array provided between the cell array blocks. As shown in FIG. 14, the second sense amplifier arrays 145a and 145b provided between the lower cell array blocks21 and 22 142b and 142d controlled by the SWL driver block 140 and the upper cell array blocks31 and 32 143a and 143c controlled by the SWL driver block 141 are exemplary shared blocks. And, there are first sense amplifier arrays 144a and 144b and third sense amplifier arrays 146a and 146b over the cell array blocks 11 and 12 142a and 142c and under the cell array blocks 41 and 42 143b and 143d, respectively, shared with the cell array blocks controlled by different SWL driver blocks. Additional address decoding, wordline driving and output circuit (not shown) are coupled to the memory device.

Figure 15:
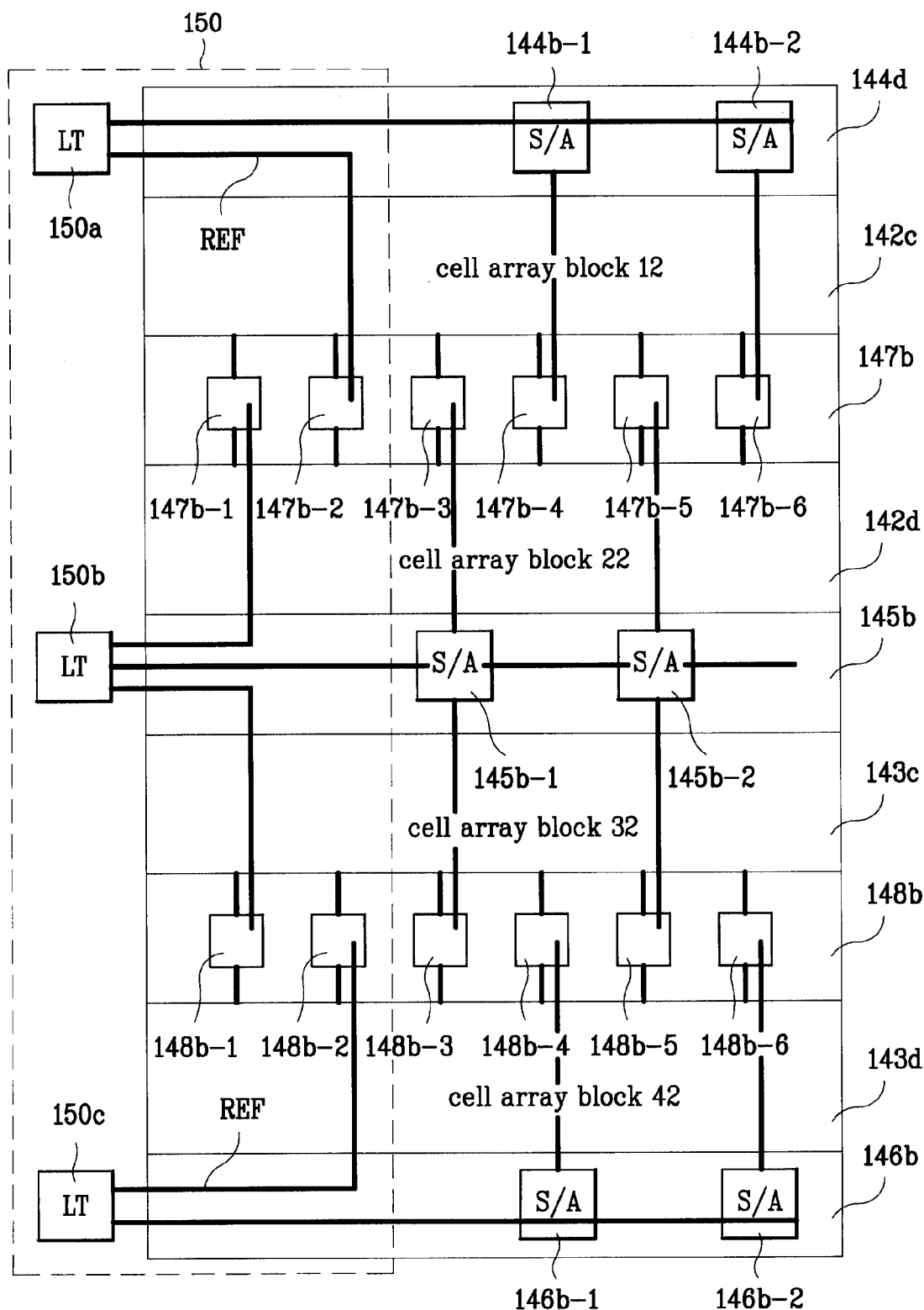
FIG. 15 is a diagram that illustrates switching device couplings between cell array blocks of FIG. 14.

FIG. 15 is a diagram that illustrates a system showing switching device connections between cell array blocks of FIG. 14. There are cell block selection switches, for example, 147b-1, 147b-2, 147b-3, 147b-4, 147b-5, and 147b-6 provided between cell array blocks 142c and 142d, and coupled to the bitlines of respective cell array blocks. Output signals of respective cell block selection switches are provided to the upper and lower sense amplifiers 144b-1, 144b-2, 145b-1, and 145b-2. That is, output signals on even numbered column cell block selection switches are preferably provided to the upper sense amplifiers 144b-1 and 144b-2, and output signals on odd numbered column cell block selection switches are preferably provided to the lower sense amplifiers 145b-1 and 145b-2. There are cell block selection switches 148b-1, 148b-2, 148b-3, 148b-4, 148b-5, and 148b-6 provided between cell array blocks 143c and 143d controlled by adjacent different SWL driver blocks, and coupled to the bitlines of respective cell array blocks. Output signals of respective cell block selection switches are provided to the upper and lower sense amplifiers 145b-1, 145b-2, 146b-1, and 146b-2. That is, output signals on even numbered column cell block selection switches are preferably provided to the upper sense amplifiers 145b-1 and 145b-2, and output signals on odd numbered column cell block selection switches are preferably provided to the lower sense amplifiers 146b-1 and 146b-2.

The sense amplifiers 145b-1 and 145b-2 in the second sense amplifier array 145b provided between the cell array controlled by different SWL driver blocks are coupled both to the switching devices 147b-3 and 147b-5, which are coupled to odd numbered column bitlines in the cell array blocks 12 and 22 142c and 142d and the switching devices 148b-3 and 148b-5, which are coupled to odd numbered column bitlines in the cell array blocks 32 and 42 143c and 143d. Switching devices coupled to even numbered column bitlines for the cell array blocks can be coupled together with switching devices that are coupled to even numbered column bitlines for cell arrays controlled by another SWL driver block to share each sense amplifier.

Connections in a reference level generating unit 150 will now be described. In a column reference cell, the cell block selection switches 147b-1 and 147b-2 each receives signals from bitlines for the reference cell arrays 142c and 142d and provides signals to the upper and lower level shift tracers 150a and 150b. That is, an output terminal on the even numbered column cell block selection switch 147b-2 is coupled to an input terminal on the upper shift tracer 150a, and an output terminal on the odd numbered column cell block selection switch 147b-1 is coupled to an input terminal on the lower shift tracer 150b. Input terminals on the cell block selection switches 148b-1 and 148b-2 receive signals from bitlines for the reference cell arrays 143c and 143d and provide signals to the upper and lower level shift tracers 150b and 150c, respectively. That is, an output terminal on the even numbered column cell block selection switch 148b-2 is coupled to an input terminal on the upper shift tracer 150b, and an output terminal on the odd numbered column cell block selection switch 148b-1 is coupled to an input terminal on the lower shift tracer 150c. Thus, such a system according to the preferred embodiments can reduce numbers of sense amplifiers and level shift tracers.

Figure 16:
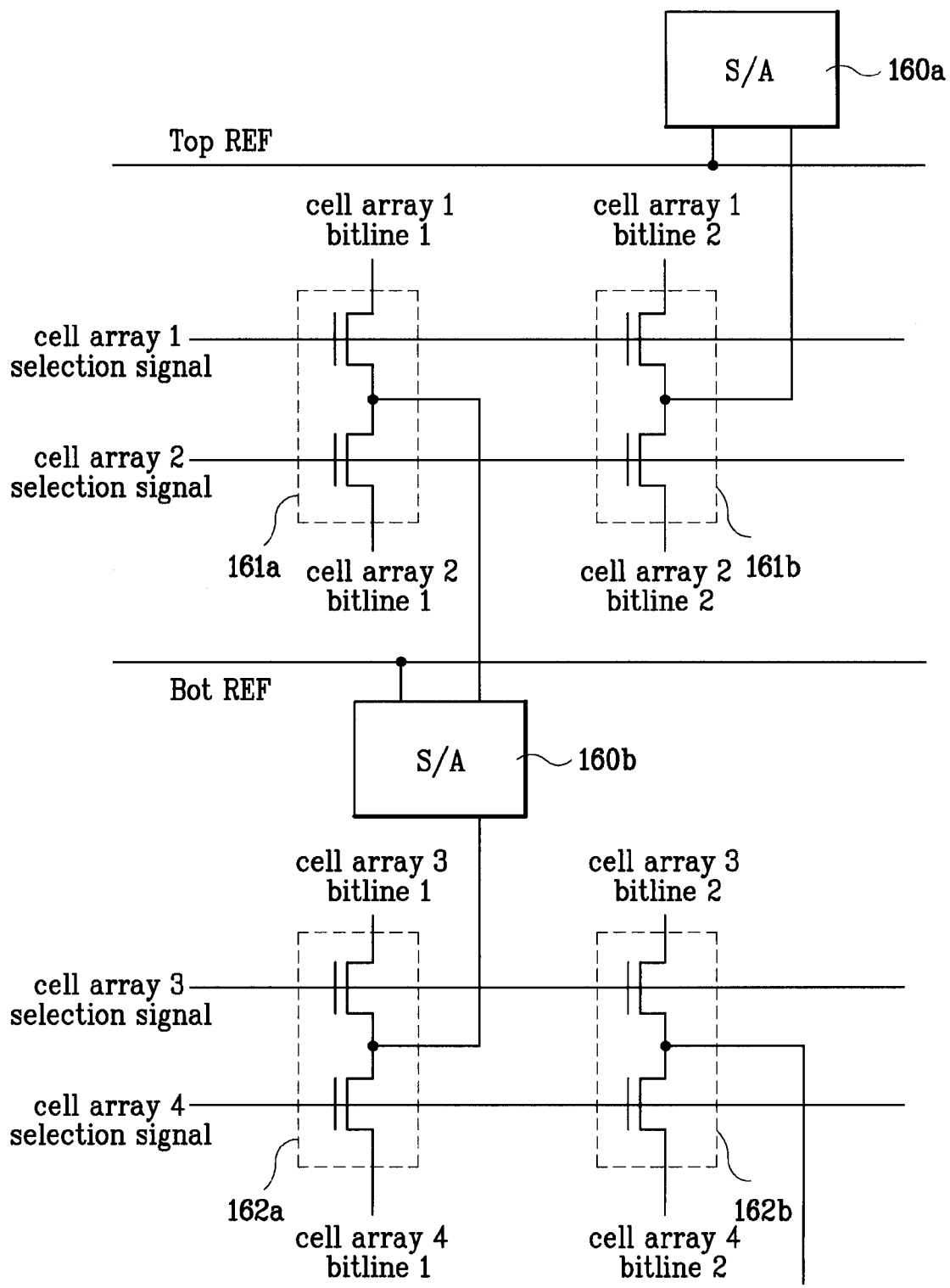
FIG. 16 is a diagram that illustrates couplings of switching devices and sense amplifier blocks between cell array blocks according to a preferred embodiment of the present invention.

Connections of the switching devices and the sense amplifiers will now be described. FIG. 16 is a diagram that illustrates detailed connections of switching devices and sense amplifier blocks between cell array blocks of FIG. 15.

As shown in FIG. 16, cell arrays 1 and 2 are preferably cell array blocks controlled by any one (e.g., a first) of SWL driver blocks, and the cell arrays 3 and 4 are cell array blocks controlled by another SWL driver block adjacent to the (e.g., first) SWL driver block. Switching devices 161a and 161b each preferably having two NMOS transistors are coupled in series and to bitlines for the cell array 1 and cell array 2, respectively. And, switching devices 162a and 162b each having two NMOS transistors are coupled in series and to bitlines for the cell array 3 and cell array 4, respectively. An SW output line on the odd numbered column cell block selection switching device 161a is preferably coupled to the lower sense amplifier 160b, and an SW output line on the even numbered column cell block selection switching device 161b is coupled to the lower sense amplifier 160a. The upper sense amplifier 160a has one input terminal that receives a signal Top REF from the level shift tracer LT or the like, and the other input terminal receives a signal passed through an SW output line on the even numbered column cell block selection switching device 161b. The lower sense amplifier 160b has one input terminal that receives a signal Bot REF from the lower level shift tracer LT or the like, and the other input terminal receives a signal passed through an SW output line on the odd numbered cell block selection switching device 161a. Since the lower sense amplifier 160b is used for input/output of data of the cells coupled to the odd numbered bitlines for the cell arrays 3 and 4, the signals passed through the SW output line on the cell block selection switching device 162a are also received.

Figure 17:
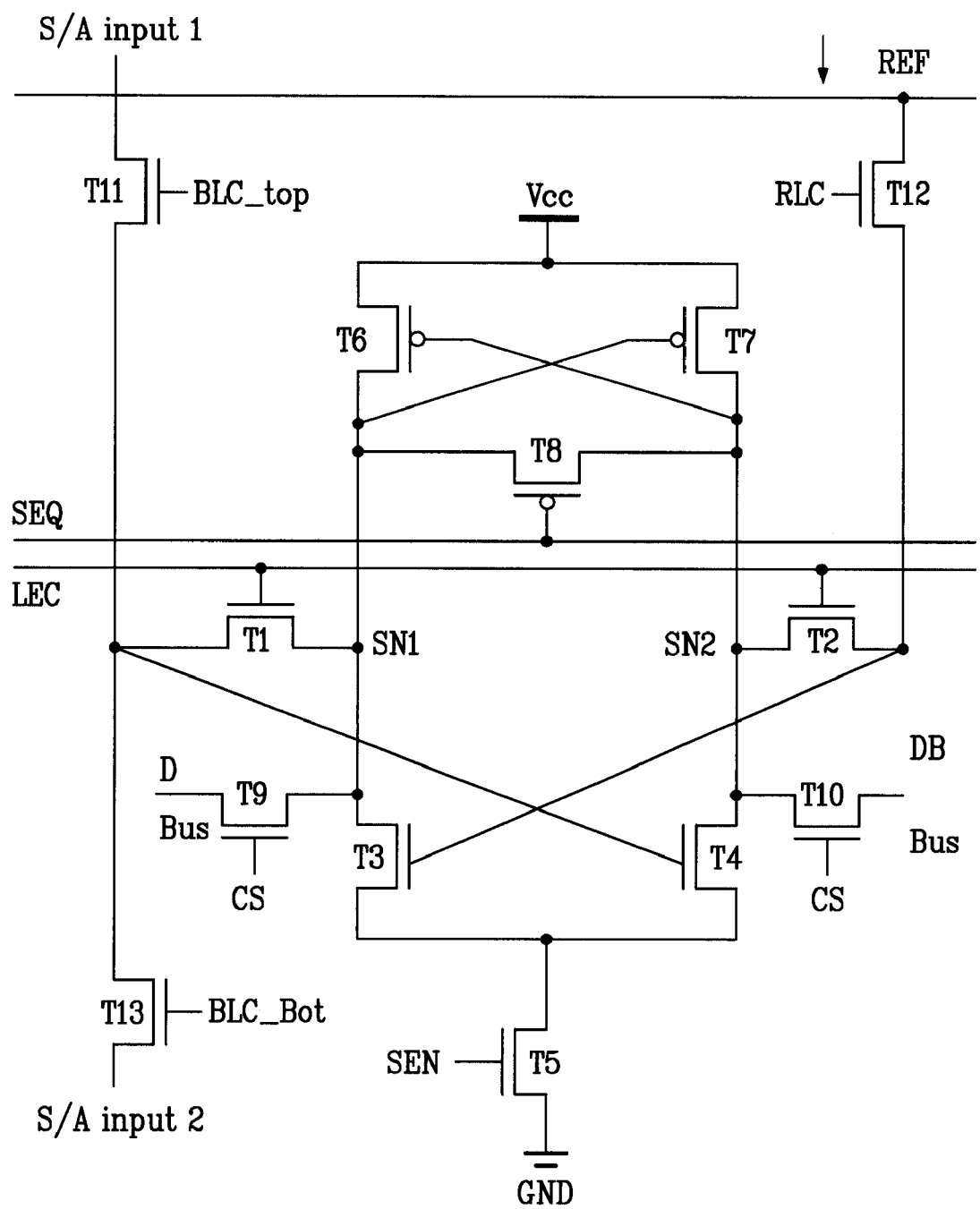
FIG. 17 is a schematic diagram that illustrates a sense amplifier block in FIG. 16.

A system of the sense amplifier 160b will now be described. FIG. 17 is a schematic diagram that illustrates the sense amplifier block in FIG. 16, which is identical to the sense amplifier in FIG. 13 except that the sense amplifier is a sense amplifier shared by the upper and lower cell array blocks. Accordingly, either one of two cell arrays is selected, and used as a main input signal in response to a BLC_top and BLC_bot signals provided to the gates of the eleventh and twelfth transistors T11 and T12.

As shown in FIG. 17, the sense amplifier 160b includes a first transistor T1 having a gate for switching the main bitline signal (e.g., S/A input 1) provided thereto, a second transistor T2 having a gate for switching a reference signal REF provided thereto, a third transistor T3 having a gate coupled to a source of the second transistor T2 and a drain coupled to a drain of the first transistor T1, and a fourth transistor T4 having a gate coupled to an input terminal on the first transistor T1 and a drain coupled to a drain of the second transistor T2. A fifth transistor T5 has a source coupled to a ground terminal and a drain coupled to sources both of the third and fourth transistors. A sixth transistor 16 has a gate coupled to a drain of the second transistor T2, a source coupled to a power source Vcc, and a drain coupled to the drain of the first transistor T1, and a seventh transistor T7 has a gate coupled to a drain of the first transistor T1, a source coupled to a power source, and a drain coupled to the drain of the second transistor T2. An eighth transistor T8 is for equalizing the drain of the sixth transistor T6 and the drain of the seventh transistor T7. A ninth transistor T9 has a source coupled to a drain of the third transistor T3 for switching an amplified signal from the main bitline to a data bus D Bus, and a tenth transistor T10 has a source coupled to a drain of the fourth transistor T4 for switching an inversed phase signal of the amplified signal from the main bitline to a data bar bus DB Bus.

In addition, there can be an eleventh transistor T11 for switching the signal from the main bitline to the source of the first transistor T1, and a twelfth transistor T12 for switching the reference signal to the source of the second transistor T2. The eleventh transistor T11 is preferably controlled by a main bitline control signal BLC_top and the twelfth transistor T12 is preferably controlled by a reference bitline control signal RLC. A thirteenth transistor T13 has a gate for receiving a main bitline control signal BLC_Bot. The first transistor T1 may feed an amplified signal back to the gate of the fourth transistor T4, and the second transistor T2 feeds an amplified signal back to the gate of the third transistor T3.

The first and second transistors T1 and T2 are preferably held in a turned on state during data write, and held in a turned off state during data read. The ninth and tenth transistors T9 and T10 are preferably controlled by a column selection signal CS. As shown in FIG. 17, the sixth, seventh, and eighth transistors T6, T7 and T8 are PMOS transistors, and the other transistors are NMOS transistors. The fifth transistor T5 is operative in response to an sense amplifier enabling signal SEN, and the eighth transistor T8 are operative in response to a sense amplifier equalizing signal SEQ. The gates of the first and second transistors T1 and T2 are provided with latch enable control signals LEC, respectively.

As described above, a memory device and a cell block structure of a nonvolatile ferroelectric memory according to preferred embodiments of the present invention have various advantages. The division of a cell array block, which is controlled by one split wordline driver block, can reduce a total bitline length. Thus, dividing a cell array block controlled by a split wordline driver into two and positioning cell selection switches in the divided cell array block can reduce a total bitline length, and reduce a bitline loading that occurs during operations of the device. Further, reduction of a number of sense amplifier array blocks provided between cell array blocks controlled by adjacent drivers from three to two facilitates a reduction of a chip layout area, and simplifies arrangement of sense amplifier arrays, which permits an effective and more rapid chip design.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A semiconductor memory device, comprising:
   a cell array block having split wordlines extending along a first direction and bitlines extending along a second direction to cross the split wordlines;
   a driver that controls the split wordlines;
   a cell block selection circuit that separates the cell array block into a first region and a second region, wherein the cell block selection circuit has one electrode coupled to a bitline for the first region, and the other electrode coupled to a bitline for the second region; and
   at least one sense amplifier array coupled to the bitlines that respectively senses a data from a cell array selected by the cell block selection circuit in one of the first region and the second region.

2. The semiconductor memory device of claim 1, further comprising a second cell array block adjacent to the cell array block that shares the driver with the cell array block.

3. The semiconductor memory device of claim 1, wherein the at least one sense amplifier array provided above the first region and the second sense amplifier array is provided below the second region, and wherein a cell in the cell array block compromises:
   a first and second split wordlines extending along the first direction;
   a first bitline extending along the second direction to cross the first and second split wordlines;
   a first transistor having a second electrode coupled to the first bitline and a control electrode coupled to the first split wordline; and
   a first ferroelectric capacitor between a first electrode of the first transistor and the second split wordline.

4. A nonvolatile ferroelectric memory, comprising:
   a cell array block with a main cell region and a column reference cell region, wherein the cell array block has split first signal lines extending along a first direction and second signal lines extending along a second direction to cross the split first signal lines at prescribed intervals;
   a cell block selection circuit that includes a plurality of switches in a separation region of the cell array block that separates the cell array block into a first and a second regions, wherein each of the switches has a first electrode coupled to a second signal line for the first region and a second electrode coupled to a second signal line for the second region;
   a first sense amplifier array that includes a first plurality of sense amplifiers, wherein each of the first sense amplifiers has a first input terminal coupled to an output line of a first group of the plurality of switches;
   a second sense amplifier array that includes a second plurality of sense amplifiers, wherein each of the second sense amplifiers has a first input terminal coupled to an output line of a second group of the plurality of switches; and
   at least one reference signal generator coupled to an output line of a switch of the cell block selection circuit coupled to second signal lines for the column reference cell region that provides a reference signal to the sense amplifiers.

5. The nonvolatile ferroelectric memory of claim 4, wherein the first sense amplifier array is above the cell array block and the second sense amplifier array is below the cell array block, wherein the at least one reference signal generator includes first and second level shift tracers coupled to prescribed switches in the reference cell region to provide the reference signal to the first and second sense arrays, respectively.

6. The nonvolatile ferroelectric memory of claim 5, wherein an output terminal on the prescribed switches is coupled to one of the input terminal on the sense amplifiers and the level shift tracers using a conductive line on a layer different from the second signal lines for the cell array block, and wherein the switches having output lines coupled to input lines on the sense amplifiers in the first and second sense amplifier arrays are the switches having electrodes coupled to second signal lines for the main cell region.

7. The nonvolatile ferroelectric memory of claim 4, wherein the switches in the cell block selection circuit include a first and a second transistors coupled in series, the first transistor has a control electrode that receives a first selection signal for the first region, and the second transistor has a control electrode that receives a second selection signal for the second region, and wherein the first and second selection signals selectively turn on the switches.

8. The nonvolatile ferroelectric memory of claim 7, wherein the first transistor has a first electrode coupled to a corresponding second signal line in the first region, the second transistor has a first electrode coupled to a corresponding second signal line in the second region, and the first and second transistors have second electrodes coupled together to an output terminal on the switch.

9. The nonvolatile ferroelectric memory of claim 4, wherein each of a plurality of unit cells in the cell array block comprises:
   a first split wordline and a second split wordline extending in a row direction spaced a prescribed distance from each other;
   a first bitline and a second bitline that cross the first and the second split wordlines;
   a first transistor that has a control electrode coupled to the first split wordline and a second electrode coupled to the first bitline;
   a first ferroelectric capacitor coupled between a first electrode of the first transistor and the second split wordline;
   a second transistor that has a control electrode coupled between the second split wordline and a second electrode coupled to the second bitline; and
   a second ferroelectric capacitor coupled between a first electrode of the second transistor and the first split wordline.

10. The nonvolatile ferroelectric memory of claim 4, wherein each of the sense amplifiers in the first and the second sense amplifier arrays comprises:
   a first transistor controlled by a first control signal that switches a first signal;
   a second transistor controlled by the first control signal that switches a second signal;
   a third transistor having a control electrode coupled with a first electrode on the second transistor and a second electrode coupled to a second electrode on the first transistor;
   a fourth transistor having a control electrode coupled with a first electrode on the first transistor and a second electrode coupled with a second electrode on the second transistor;
   a fifth transistor that has a second electrode coupled with first electrodes of the third and the fourth transistors, and a first electrode coupled with a first reference voltage, wherein the fifth transistor is controlled by a second control signal;
   a sixth transistor having a first electrode coupled with a second reference voltage and a second electrode coupled with the second electrode of the first transistor;
   a seventh transistor having a first electrode coupled with the second reference voltage and a second electrode commonly coupled with the second electrode of the second transistor and a control electrode of the sixth transistor;
   an eighth transistor that equalizes the second electrodes of the sixth and the seventh transistors, wherein the eighth transistor is controlled by a third control signal;
   a ninth transistor that switches the first signal;
   a tenth transistor that switches the second signal;
   an eleventh transistor coupled between the second electrode of the third transistor and a data line that is controlled by a fourth control signal; and
   a twelfth transistor coupled between the second electrode of the fourth transistor and a data bar line, wherein the twelfth transistor is controlled by the fourth control signal.

11. The nonvolatile ferroelectric memory of claim 10, wherein said each of the sense amplifiers in the first and the second sense amplifier arrays comprises:
   an eleventh transistor that switches the first signal; and
   a twelfth transistor that switches the second signal, wherein the first transistor feeds an amplified signal back to the control electrode of the fourth transistor, and wherein the second transistor feeds an amplified signal back to the control electrode of the third transistor.

12. A nonvolatile ferroelectric memory, comprising:
   cell array blocks that each include a plurality of split wordlines and bitlines substantially perpendicular to the split wordlines;
   a plurality of split wordline drivers each provided between two of the cell array blocks that control unit cells in two corresponding cell array blocks;
   a cell block selection switching unit that includes switches that separate a first cell array block into a first and a second regions, wherein each of the switches has a first electrode coupled to a corresponding bitline of the first region and a second electrode coupled to a corresponding bitline of the second region; and
   first and second sense amplifier arrays respectively above and below a corresponding cell array block to sense data of one of the first region and the second region cell of the corresponding cell array block selected by the cell block selection switching unit, wherein the sense amplifier array provided between adjacent cell array blocks controlled by different ones of the plurality of split wordline drivers are shared by the adjacent cell array blocks.

13. The nonvolatile ferroelectric memory of claim 12, wherein the cell array block includes a column reference cell region, and a cell block selection switch in correspondence to the column reference cell region includes a first electrode coupled to a bitline of the column reference cell region for the first region, and a second electrode coupled to a bitline of the column reference cell region for the second region and an output terminal coupled to a level shift tracer.

14. The nonvolatile ferroelectric memory of claim 13, wherein first and second level shift tracers correspond respectively to the first and second sense amplifier arrays, and output terminals on the cell block selection switches in correspondence to the column reference cell regions are alternately coupled to the first and second level shift tracers.

15. The nonvolatile ferroelectric memory of claim 13, wherein a corresponding level shift tracer in correspondence to the sense amplifier array provided between the adjacent cell array blocks controlled by the different split wordline drivers is coupled to output terminals on cell block selection switches in correspondence to the column reference cell regions in the two adjacent cell array blocks.

16. The nonvolatile ferroelectric memory of claim 12, wherein output terminals on adjacent ones of the switches in the cell block selection switching unit are alternately coupled to input terminals on the first and second sense amplifier arrays, respectively.

17. The nonvolatile ferroelectric memory of claim 16, wherein the switches in the cell block selection circuit includes a first and a second transistors coupled in series, wherein the first transistor has a control electrode that receives a first cell array selection signal for the first region, and the second transistor has a control electrode that receives a second cell array selection signal for the second region, and wherein the first and second cell array selection signals selectively enable the transistors.

18. The nonvolatile ferroelectric memory of claim 17, wherein the first transistor has a first electrode coupled to a corresponding bitline in the first region, the second transistor has a first electrode coupled to a corresponding bitline in the second region, and the first and second transistors have second electrodes coupled together to an output terminal.

19. The nonvolatile ferroelectric memory of claim 12, wherein each of a plurality of unit cells in the cell array blocks comprises:

a first split wordline and a second split wordline extending in a row direction spaced a prescribed distance from each other;

a first bitline and a second bitline that cross the first and the second split wordline;

a first transistor that has a control electrode coupled to the first split wordline and a second electrode coupled to the first bitline;

a first ferroelectric capacitor coupled between a first electrode of the first transistor and the second split wordline;

a second transistor that has a control electrode coupled between the second split wordline and a second electrode coupled to the second bitline; and a second ferroelectric capacitor coupled between a first electrode of the second transistor and the first split wordline.

20. The semiconductor memory device of claim 1, wherein the sensed data from the selected cell array in the selected region is transmitted through the cell block selection circuit.

* * * * *